(12) United States Patent
Matsumoto

(10) Patent No.: US 10,581,006 B2
(45) Date of Patent: Mar. 3, 2020

(54) DISPLAY DEVICE AND MANUFACTURING METHOD THEREOF

(71) Applicant: Japan Display Inc., Tokyo (JP)

(72) Inventor: Yuko Matsumoto, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/956,866

(22) Filed: Apr. 19, 2018

(65) Prior Publication Data

US 2018/0309079 A1 Oct. 25, 2018

(30) Foreign Application Priority Data

Apr. 21, 2017 (JP) ................................. 2017-084460

(51) Int. Cl.
*H01L 51/50* (2006.01)
*H01L 51/52* (2006.01)
*H01L 27/32* (2006.01)
*H01L 51/56* (2006.01)
*G06F 1/16* (2006.01)
*G06F 3/044* (2006.01)

(52) U.S. Cl.
CPC ........ *H01L 51/5012* (2013.01); *G06F 1/1637* (2013.01); *G06F 1/1643* (2013.01); *G06F 1/1656* (2013.01); *G06F 3/044* (2013.01); *H01L 27/323* (2013.01); *H01L 27/3265* (2013.01); *H01L 51/5056* (2013.01); *H01L 51/5072* (2013.01); *H01L 51/5092* (2013.01); *H01L 51/5203* (2013.01); *H01L 51/5237* (2013.01); *H01L 51/56* (2013.01); *G06F 2203/04103* (2013.01); *H01L 27/3234* (2013.01)

(58) Field of Classification Search
CPC ............ H01L 51/5012; H01L 51/5056; H01L 51/5072; H01L 27/323; H01L 51/5203; H01L 51/56; H01L 51/5237; H01L 51/5092
USPC ...................... 257/40, 72, 79; 438/22, 82.99
See application file for complete search history.

(56) References Cited

U.S. PATENT DOCUMENTS

| | | | |
|---|---|---|---|
| 2015/0130726 A1 | 5/2015 | Min et al. | |
| 2016/0306472 A1* | 10/2016 | Park et al. | ............ G06F 3/0412 |
| 2018/0097199 A1* | 4/2018 | Jo et al. | ............ H01L 51/5253 |

* cited by examiner

*Primary Examiner* — Thinh T Nguyen
(74) *Attorney, Agent, or Firm* — Michael Best & Friedrich LLP

(57) ABSTRACT

Disclosed is a display device which includes: a substrate having a first edge portion and a second edge portion; a plurality of light-emitting elements over the substrate; a passivation film over the plurality of light-emitting elements; a barrier layer over the passivation film; and a touch sensor over the barrier layer. The barrier layer has a first sidewall along the first edge portion and a second sidewall along the second edge portion, and a first angle between a top surface of the substrate and the first sidewall is different from a second angle between the top surface and the second sidewall.

10 Claims, 25 Drawing Sheets

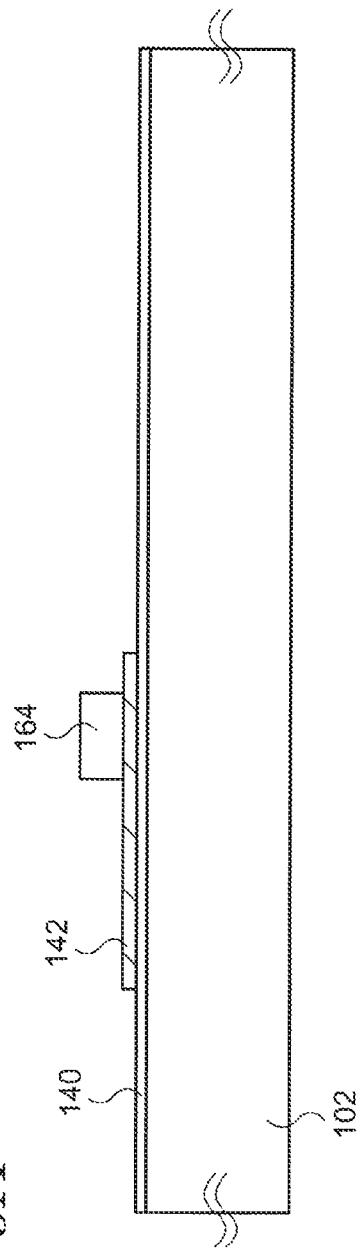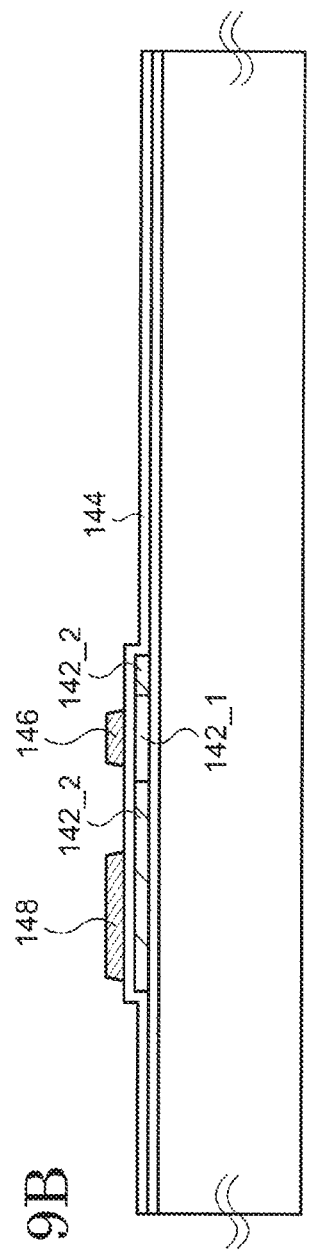

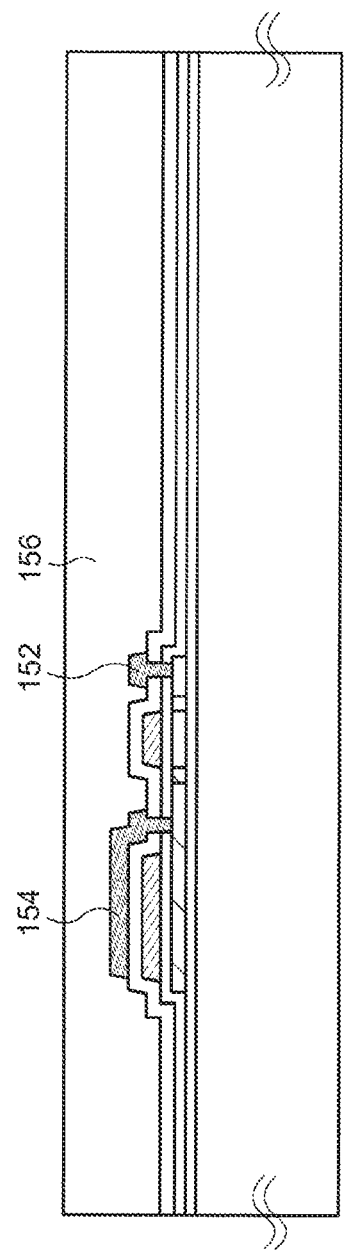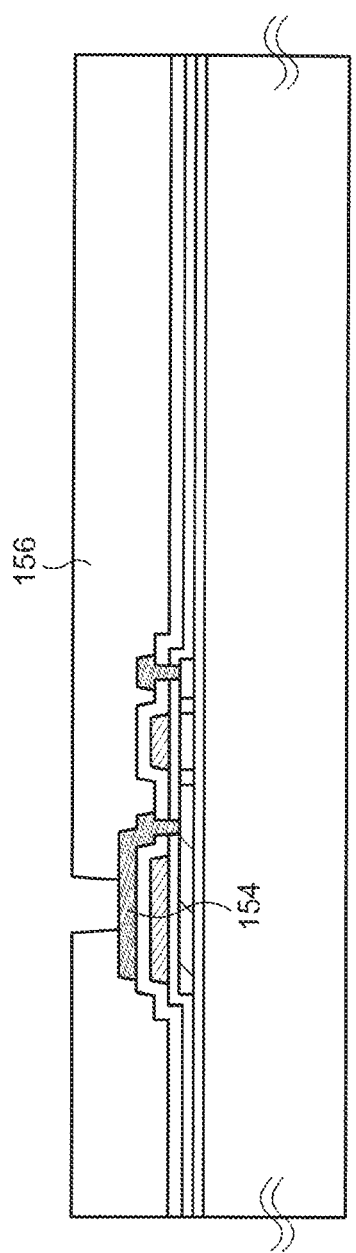

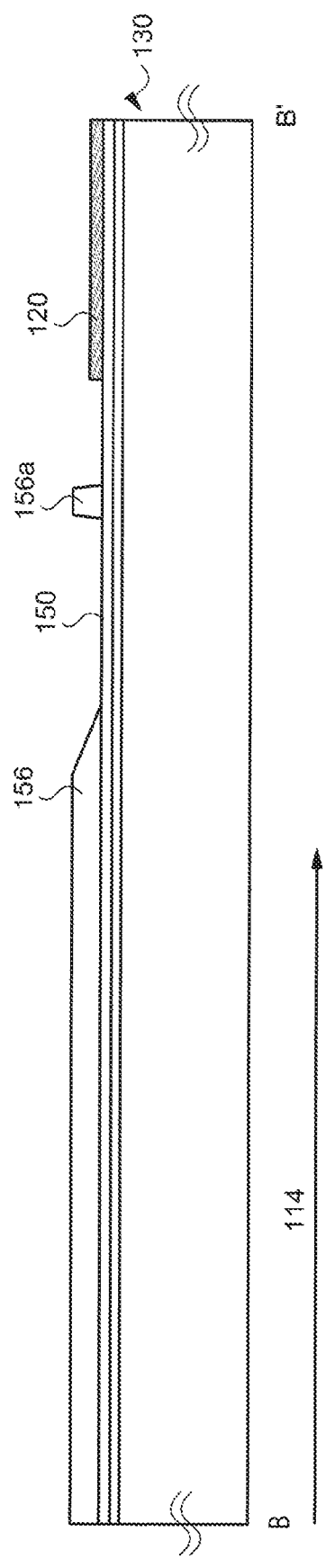
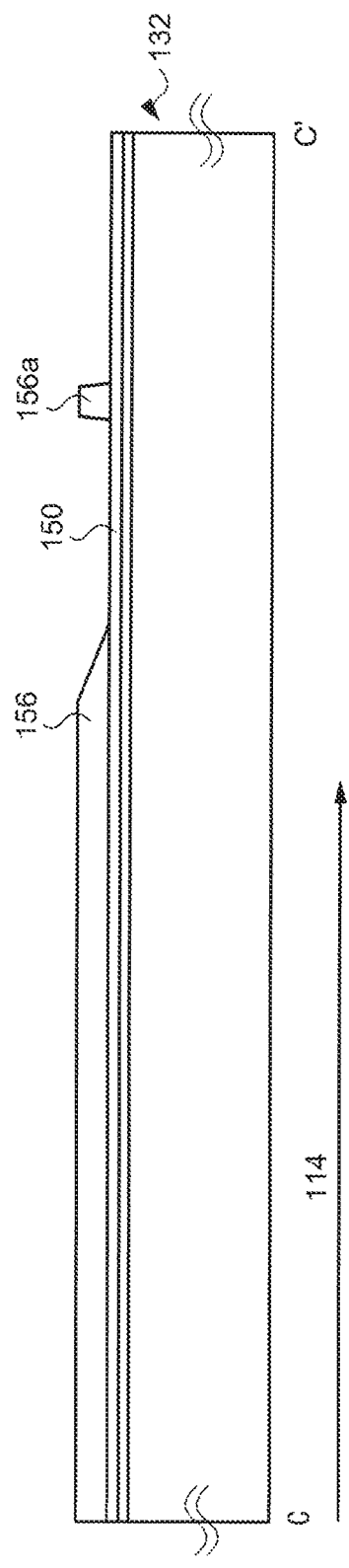
FIG. 12A
FIG. 12B

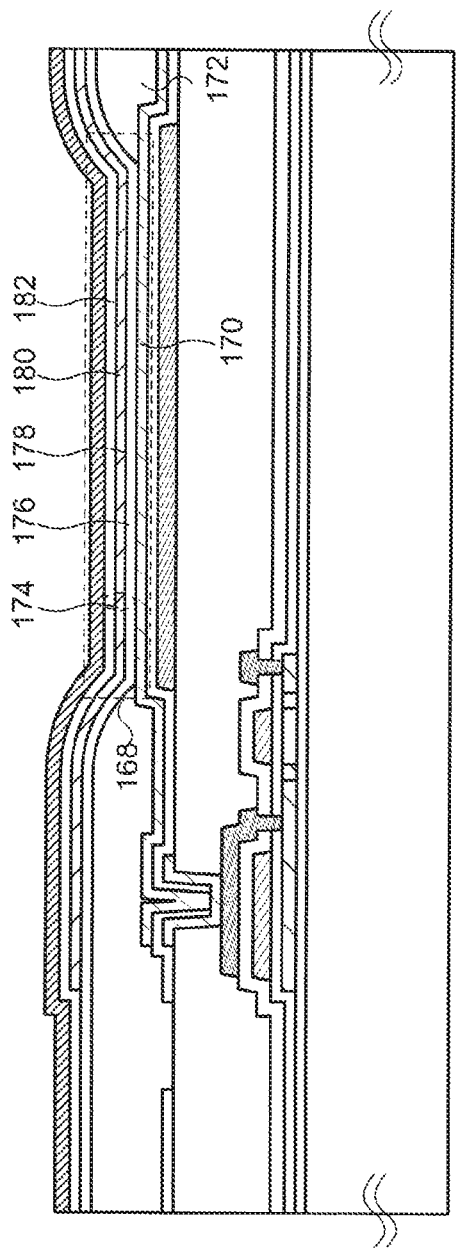
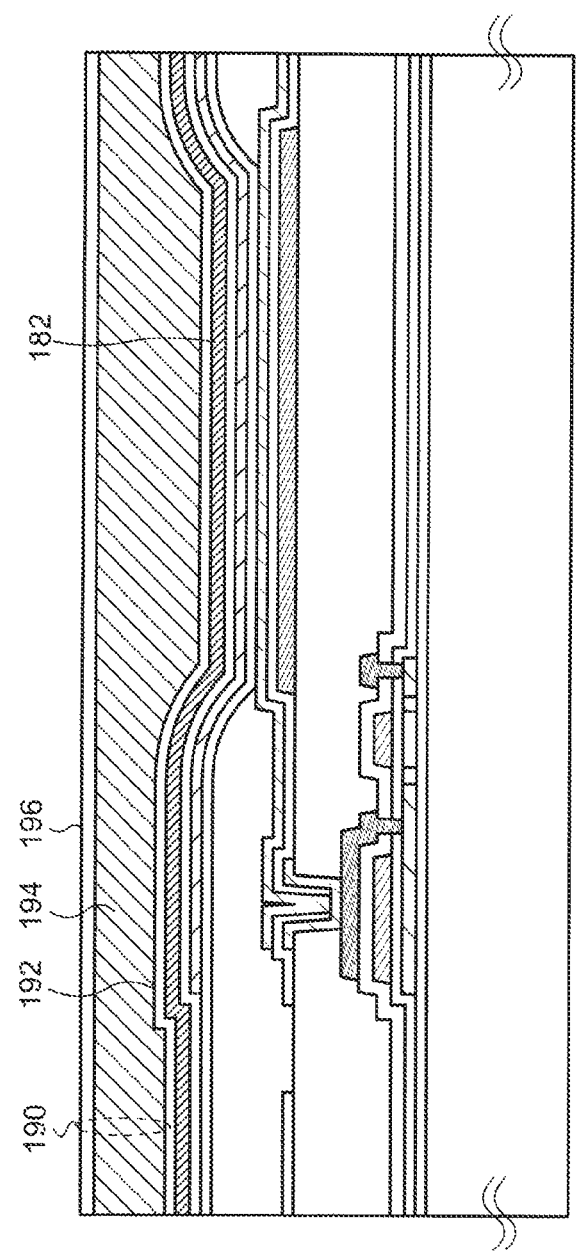
FIG. 14A
FIG. 14B

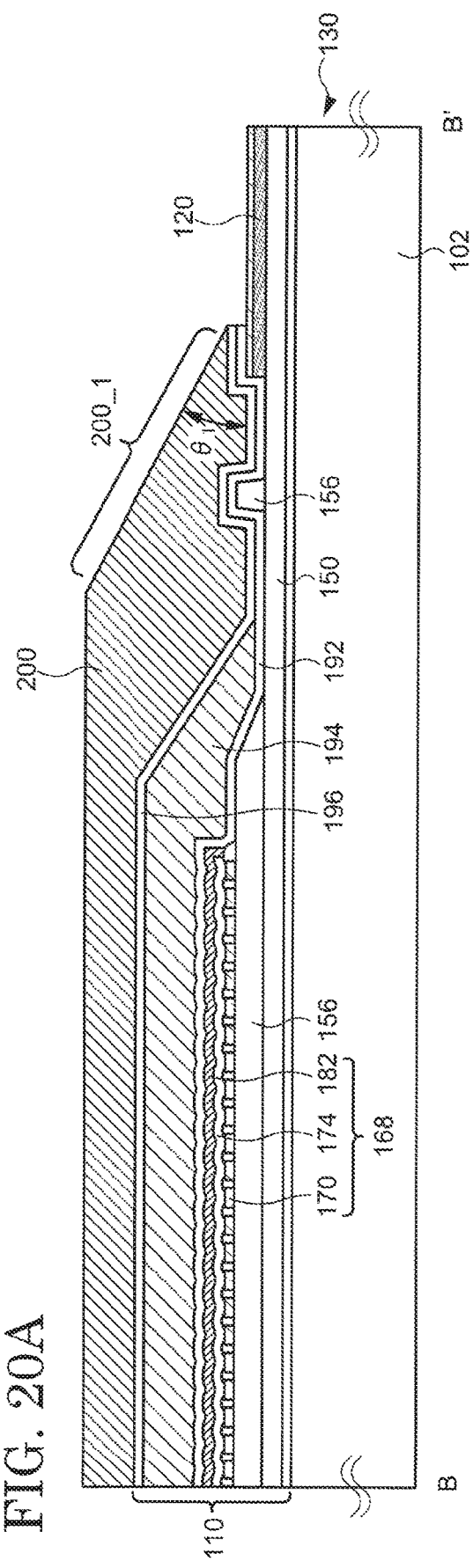
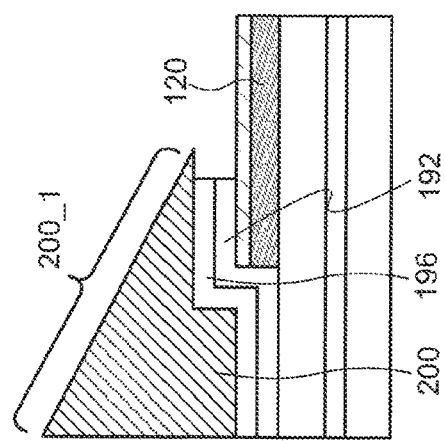
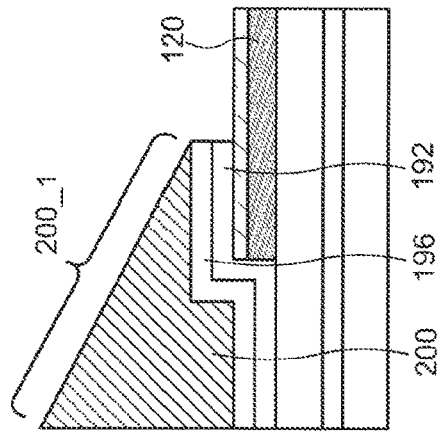

DISPLAY DEVICE AND MANUFACTURING METHOD THEREOF

This application is based on and claims the benefit of priority from the prior Japanese Patent Application No. 2017-84460, filed on Apr. 21, 2017, the entire contents of which are incorporated herein by reference.

FIELD

An embodiment of the present invention relates to a display device and a manufacturing method of the display device. For example, an embodiment of the present invention relates to a display device on which a touch sensor is mounted and a manufacturing method of the display device.

BACKGROUND

A touch sensor has been known as an interface for a user to input information to a display device. Arrangement of a touch sensor so as to overlap with a screen of a display device allows a user to operate an input buttons or icons displayed on the screen, by which information can be readily input to the display device. For example, US Patent Application Publication No. 2015/0130726 discloses an electronic apparatus in which a touch sensor is mounted on an organic EL display device. In this Publication, a sealing film is formed over an organic EL element (hereinafter, referred to as a light-emitting element) over which touch electrodes for a touch sensor are provided.

SUMMARY

An object of an embodiment according to the present invention is to provide a display device and a manufacturing method thereof. For example, one of the objects of the embodiments according to the present invention is to provide a highly reliable display device on which a touch sensor is mounted and a manufacturing method thereof.

An embodiment of the present invention is a display device. The display device includes: a substrate having a first edge portion and a second edge portion; a plurality of light-emitting elements over the substrate; a passivation film over the plurality of light-emitting elements; a barrier layer over the passivation film; and a touch sensor over the barrier layer. The barrier layer has a first sidewall along the first edge portion and a second sidewall along the second edge portion, and a first angle between a top surface of the substrate and the first sidewall is different from a second angle between the top surface of the substrate and the second sidewall.

An embodiment of the present invention is a display device. The display device includes: a substrate having a first edge portion and a second edge portion; a plurality of pixels over the substrate, the plurality of pixels each including a transistor and a light-emitting element electrically connected to the transistor; a passivation film over the plurality of pixels; a barrier layer over the passivation film; and a touch sensor over the barrier layer. The barrier layer has a first sidewall along the first edge portion and a second sidewall along the second edge portion, and a first angle between a top surface of the substrate and the first sidewall is different from a second angle between the top surface of the substrate and the second sidewall.

An embodiment of the present invention is a manufacturing method of a display device. The manufacturing method includes: forming a display region by forming a plurality of light-emitting elements over a substrate having a first edge portion and a second edge portion; forming a passivation film over the plurality of light-emitting elements; forming a barrier layer over the passivation film; and forming a touch sensor over the barrier layer. The formation of the barrier layer is performed by forming a rib by selectively applying a solution of a polymer along the second edge portion without applying the solution over the display region and a region between the display region and the first edge portion, and then applying the solution of the polymer over the display region and the region.

BRIEF DESCRIPTION OF DRAWINGS

FIG. 9A and FIG. 9B are schematic cross-sectional views for explaining a manufacturing method of a display device according to an embodiment of the present invention;

FIG. 11A and FIG. 11B are schematic cross-sectional views for explaining a manufacturing method of a display device according to an embodiment of the present invention;

FIG. 12A and FIG. 12B are schematic cross-sectional views for explaining a manufacturing method of a display device according to an embodiment of the present invention;

FIG. 14A and FIG. 14B are schematic cross-sectional views for explaining a manufacturing method of a display device according to an embodiment of the present invention;

FIG. 20A to FIG. 20C are schematic cross-sectional views for explaining a manufacturing method of a display device according to an embodiment of the present invention;

DESCRIPTION OF EMBODIMENTS

Hereinafter, the embodiments of the present invention are explained with reference to the drawings. The invention can be implemented in a variety of different modes within its concept and should not be interpreted only within the disclosure of the embodiments exemplified below.

The drawings may be illustrated so that the width, thickness, shape, and the like are illustrated more schematically compared with those of the actual modes in order to provide a clearer explanation. However, they are only an example, and do not limit the interpretation of the invention. In the specification and the drawings, the same reference number is provided to an element that is the same as that which appears in preceding drawings, and a detailed explanation may be omitted as appropriate.

In the present specification and claims, when a plurality of films is formed by processing one film, the plurality of films may have functions or rules different from each other. However, the plurality of films originates from a film formed as the same layer in the same process and has the same layer structure and the same material. Therefore, the plurality of films is defined as films existing in the same layer.

In the specification and the claims, unless specifically stated, when a state is expressed where a structure is arranged "on" or "over" another structure, such an expression includes both a case where the substrate is arranged directly above the "other structure" so as to be in contact with the "other structure" and a case where the structure is arranged over the "other structure" with an additional structure therebetween.

In the specification and the claims, an expression "a structural body is exposed from another structural body" means a mode in which a part of the structural body is not covered by a part of the other structural body and includes a mode in which the part uncovered by the other structural body is further covered by a yet another structural body.

First Embodiment

1. Outline Structure

Figure 1:
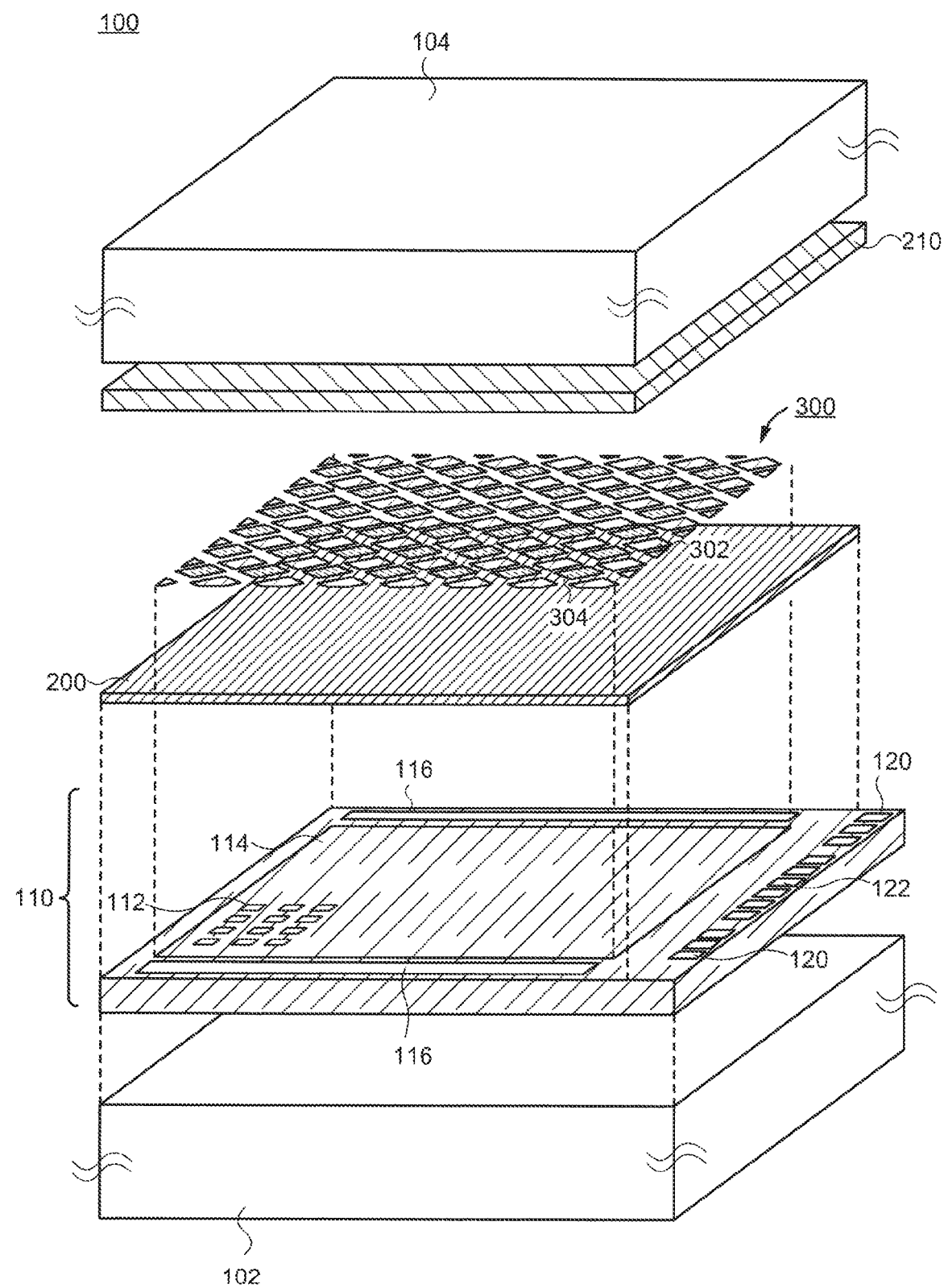
FIG. 1 is a schematic perspective view of a display device according to an embodiment of the present invention.

FIG. 1 shows a schematic perspective view of a display device 100 according to an embodiment. Although FIG. 1 shows a state where the display device 100 is developed for promoting understanding, the display device 100 is supplied for usage in a state where the structural elements shown in FIG. 1 are integrated.

The display device 100 possesses a substrate 102 and an opposing substrate 104 facing the substrate 102. A display unit 110 providing a display function to the display device 100, a touch sensor 300, and a barrier layer 200 between the display unit 110 and the touch sensor 300 are disposed between the substrate 102 and the opposing substrate 104. The barrier layer 200 is provided so as to cover at least a display region 114 of the display unit 110. The display device 100 may have a polarizing plate 210 as an optional structure between the touch sensor 300 and the opposing substrate 104.

2. Touch Sensor

Figure 2:
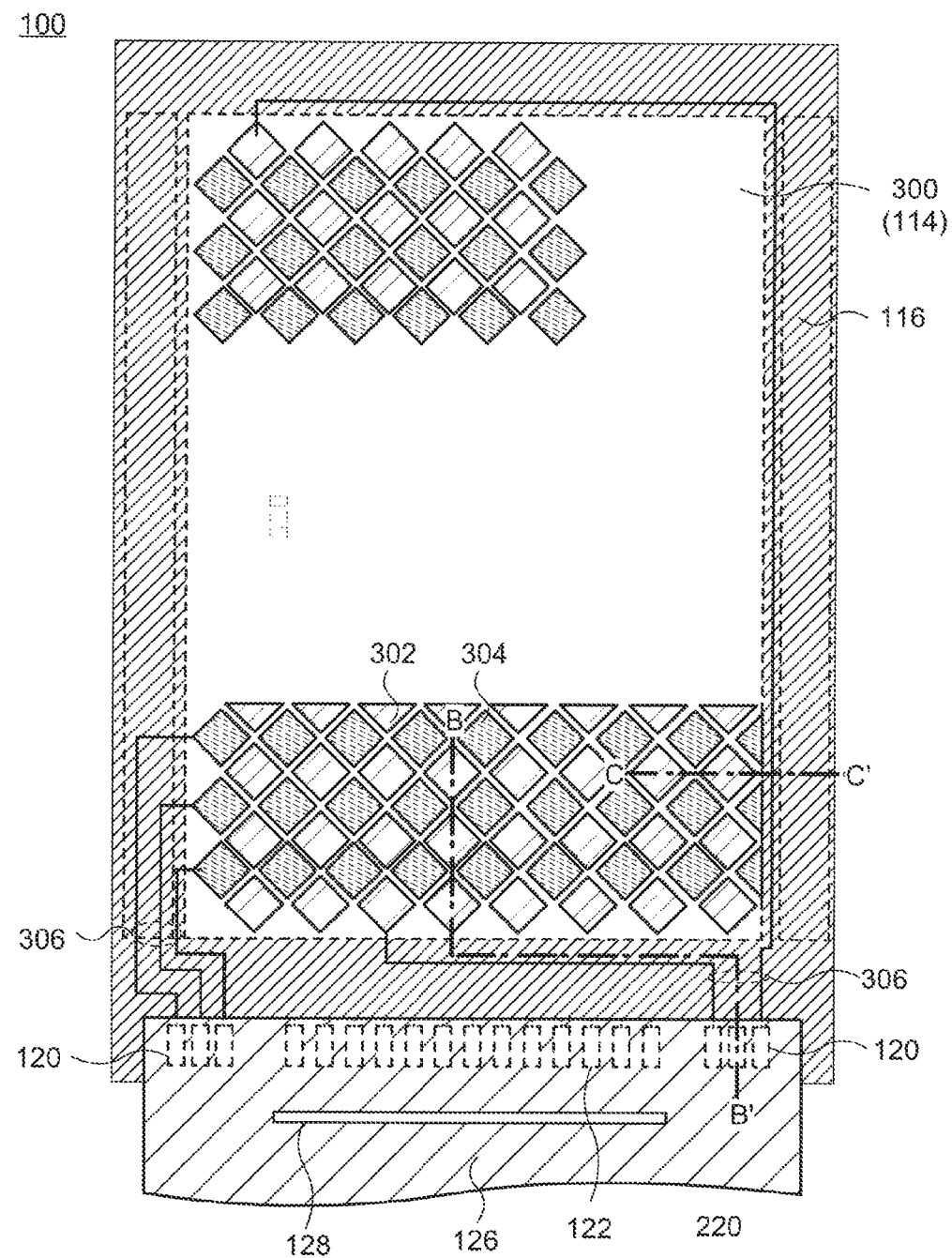
FIG. 2 is a schematic top view of a display device according to an embodiment of the present invention.

A schematic top view of the display device 100 is shown in FIG. 2. Here, the opposing substrate 104 and the polarizing plate 210 are not illustrated. The touch sensor 300 possesses a plurality of first touch electrodes 302 arranged in a stripe form in a column direction and a plurality of second touch electrodes 304 arranged in a stripe form in a row direction and intersecting the first touch electrodes 302. One of the first touch electrode 302 and the second touch electrode 304 is also called a transmitting electrode (Tx), and the other is called a receiving electrode (Rx). The touch sensor 300 is disposed so as to overlap with the display region 114 and may have substantially the same size and shape as the display region 114.

Figure 3A:
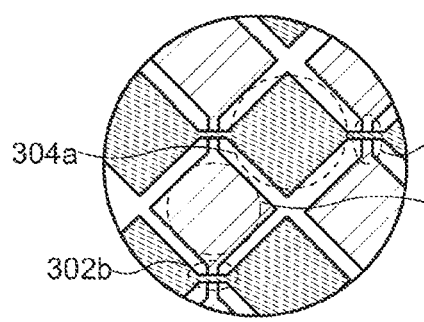
FIG. 3A to 3C are enlarged top views of a display device according to an embodiment of the present invention.

An enlarged view of the touch sensor 300 is shown in FIG. 3A. As shown in FIG. 3A, the first touch electrodes 302 each have a plurality of quadrangle regions (diamond electrode) 302a having a substantially quadrangle shape and connection regions 302b connecting adjacent diamond electrodes 302a. Similarly, the second electrodes 304 each have a plurality of diamond electrodes 304a and connection regions 304b connecting adjacent diamond electrodes 304a. Each of the first touch electrodes 302 and each of the second touch electrodes 304 are separated and electrically independent from each other via an insulating layer which is not illustrated, and capacitance is formed therebetween. When a finger of a person or the like touches the display region 114 through the first touch electrodes 302 and the second touch electrodes 304 (hereinafter, referred to as a touch), the capacitance is changed, and a touch position can be determined by reading out this change. Thus, the touch sensor 300 of a so-called electrostatic capacity type is formed with the first touch electrodes 302 and the second touch electrodes 304.

Figure 3B:
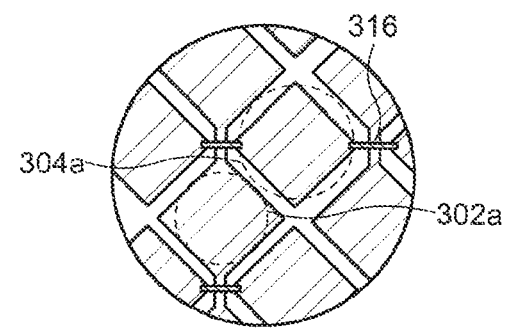

An example is shown in FIG. 3A where the diamond electrodes 302a and 302b exist in different layers. However, the touch sensor 300 may be configured so that these electrodes exist in the same layer as shown in FIG. 3B. In this case, bridge electrodes 316 function as the connection regions 302b or the connection regions 304b and perform electrical connection between adjacent diamond electrodes 302 or between adjacent diamond electrodes 304.

Figure 3C:
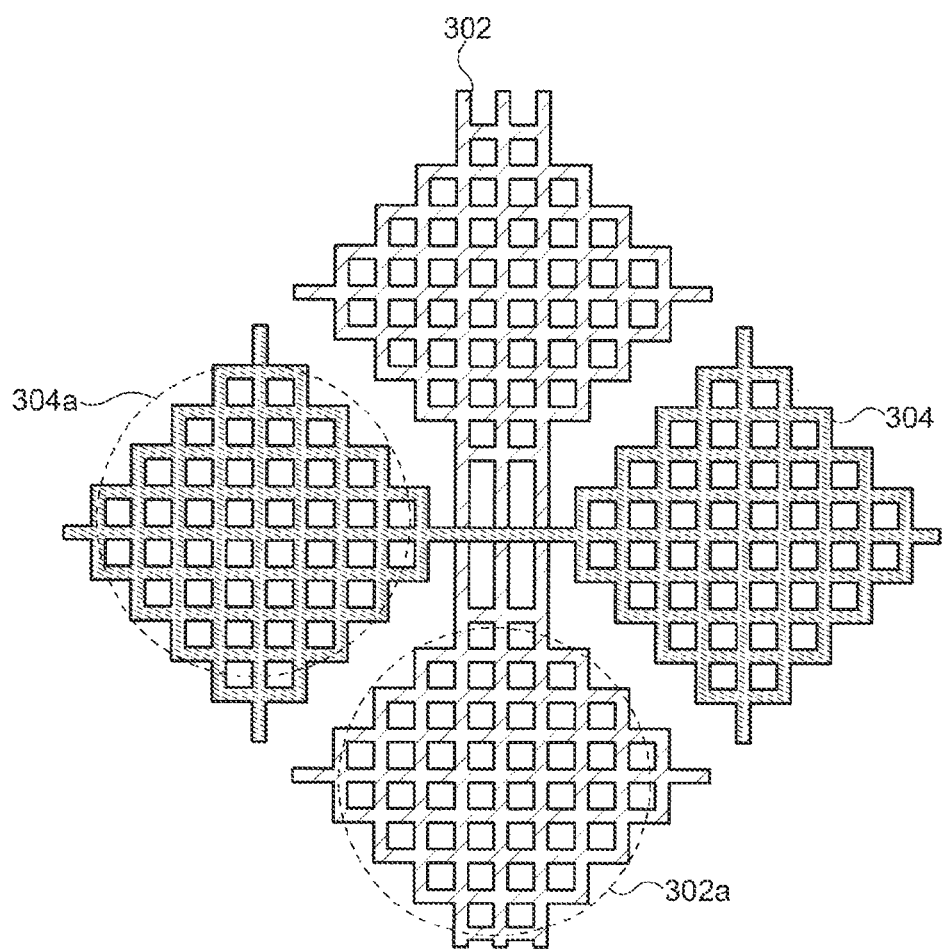

The diamond electrodes 302a and 304a each may be a conductive layer without an opening as shown in FIG. 3A and FIG. 3B or may be formed with mesh-shaped wirings having openings as shown in FIG. 3C. In the case of the conductive layer without an opening, the first touch electrodes 302 and the second touch electrodes 304 may include a conductive oxide capable of transmitting visible light, such as indium-tin oxide (ITO) and indium-zinc oxide (IZO). When the mesh-shaped wirings are applied, the first touch electrodes 302 and the second touch electrodes 304 may include a metal such as aluminum, molybdenum, tungsten, titanium, and copper or an alloy thereof in addition to the conductive oxide described above.

The first touch electrodes 302 and the second touch electrodes 304 are electrically connected to wirings 306. The wirings 306 extend to a vicinity of an edge portion of the substrate 102 through a region which does not overlap with the display region 114 and are electrically connected to terminals 120 in the display unit 110 (FIG. 2). The terminals 120 are connected to a connector 126 such as a flexible printed circuit (FPC) substrate, and signals for a touch sensor are supplied to the first touch electrodes 302 and the second touch electrodes 304 from an external circuit (not illustrated) via the terminals 120, by which the touch sensor 300 is controlled.

3. Display Unit

Figure 4:
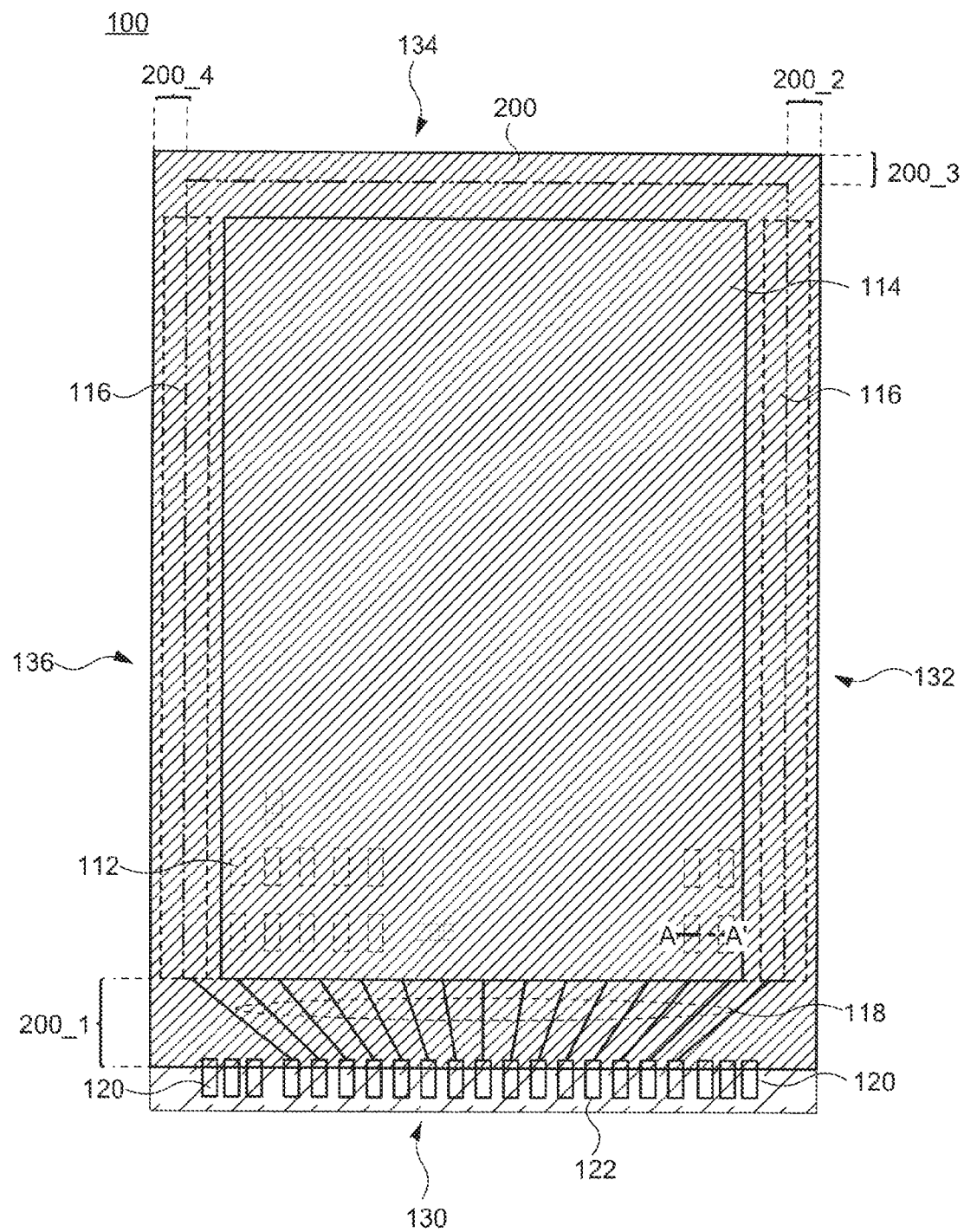
FIG. 4 is a schematic top view of a display device according to an embodiment of the present invention.

A schematic top view of the display unit 110 and the barrier layer 200 is shown in FIG. 4. The display unit 110 is structured by stacking a variety of patterned insulating layers, conductive layers, and semiconductor layers. Pixels 112, driver circuits 116, the terminals 120, and terminals 122 are formed with these various layers.

The plurality of pixels 112 is arranged in a matrix shape to form the display region 114. A display element such as a light-emitting element or a liquid crystal element and one or more transistors electrically connected to the display element are disposed in each of the pixels 112. The colors given by the pixels 112 are determined by the display elements or properties of a color filter provided over the pixels 112 as an optional structure. In the present specification and claims, the pixel 112 is the minimum unit having one display element and structures a part of an image reproduced in the display region 114.

Full-color display can be performed by arranging display elements giving red, green, and blue colors in the pixels 112, for example. Alternatively, full-color display may be performed by using a display element giving white color in all of the pixels 112 and extracting red, green, and blue colors from the respective pixels 112 with a color filter. Arrangement of the pixels 112 is not limited, and a stripe arrangement, a PenTile arrangement, a mosaic arrangement, and the like may be employed.

The driver circuits 116 for controlling operation of the pixels 112 are provided outside the display region 114. Here, an example is shown where two driver circuits 116 are formed to sandwich the display region 114. However, the pixels 112 may be controlled by using a single driver circuit 116. It is not necessary that driver circuits 116 be formed with the display unit 110. An IC chip or the like formed over a substrate (semiconductor substrate or the like) different from the substrate 102 may be arranged, as a driver circuit, over the display unit 110 or the connector 126 to control each of the pixels 112. In the present embodiment, an example is demonstrated where the pixels 112 are mainly controlled with the driver circuits 116 and an IC chip 128 disposed over the connector 126 as shown in FIG. 2. Note that the IC chip 128 may control the touch sensor 300, or the touch sensor 300 may be controlled with an additional IC chip different from the IC chip 128.

Wirings 118 extend from the display region 114 and the driver circuits 116 to the edge portion of the substrate 102. The wirings 118 form the terminals 122 at the edge portion of the substrate 102 in the display unit 110. The terminals 122 are electrically connected to the connector 126. Image signals are supplied to the pixels 112 from an external circuit which is not illustrated through the IC chip 128 and the driver circuits 116, by which the transistors and the display elements are controlled.

As shown in FIG. 1, FIG. 2, and FIG. 4, the substrate 102 may have a quadrangle shape. In this case, the substrate 102 has a first side 130, a second side 132, a third side 134, and a fourth side 136 as a first edge portion, a second edge portion, a third edge portion, and a fourth edge portion, respectively (FIG. 4). The first side 130 and the third side 134 face each other and sandwich the display region 114. In a similar way, the second side 132 and the fourth side 136 also face each other and sandwich the display region 114. The terminals 120 and 122 may be arranged along one of the sides of the substrate 102 (first side 130), which allows image signals and signals for a touch sensor to be supplied to the display device 100 by using a single connector 126.

4. Barrier Layer

The barrier layer 200 is provided over the display unit 110 and covers the display region 114 and the wirings 118. The barrier layer 200 may further cover a part of the terminals 120 and 122 and the driver circuits 116. The barrier layer 200 may include a polymer. The polymer preferably has a high gas-barrier property and can be selected from polymers having a vapor permeability equal to or higher than $1 \times 10^{-2}$ $g/m^2 \cdot day$ and equal to or lower than 100 $g/m^2 \cdot day$, equal to or higher than $1 \times 10^{-2}$ $g/m^2 \cdot day$ and equal to or lower than 50 $g/m^2 \cdot day$, or equal to or higher than $1 \times 10^{-2}$ $g/m^2 \cdot day$ and equal to or lower than 10 $g/m^2 \cdot day$, for example. As such a polymer, a polyolefin such as polyethylene and polypropylene or a copolymer thereof, polyacrylonitrile or a copolymer thereof, poly(vinylidene chloride) and a copolymer thereof, a aliphatic polyamide, a polyester such as poly(ethylene terephthalate) and poly(ethylene terenaphthalate), poly(vinyl chloride) and a copolymer thereof, a fluorine-containing polyethylene and a copolymer thereof, a polysilazane and a copolymer thereof, a polycarbonate having a diaryl carbonate as a fundamental skeleton and a copolymer thereof, and the like are given as examples. These polymers may have a linear chain structure. Alternatively, the barrier layer 200 may include a polymer such as an epoxy resin or an acrylic resin which intermolecularly crosslinks to form a three-dimensional network. The barrier layer 200 can be formed with a so-called wet-type film-forming method such as an ink-jet method, a spin-coating method, and a dip-coating method.

5. Cross-Sectional Structure 5-1. Display Unit

Figure 5:
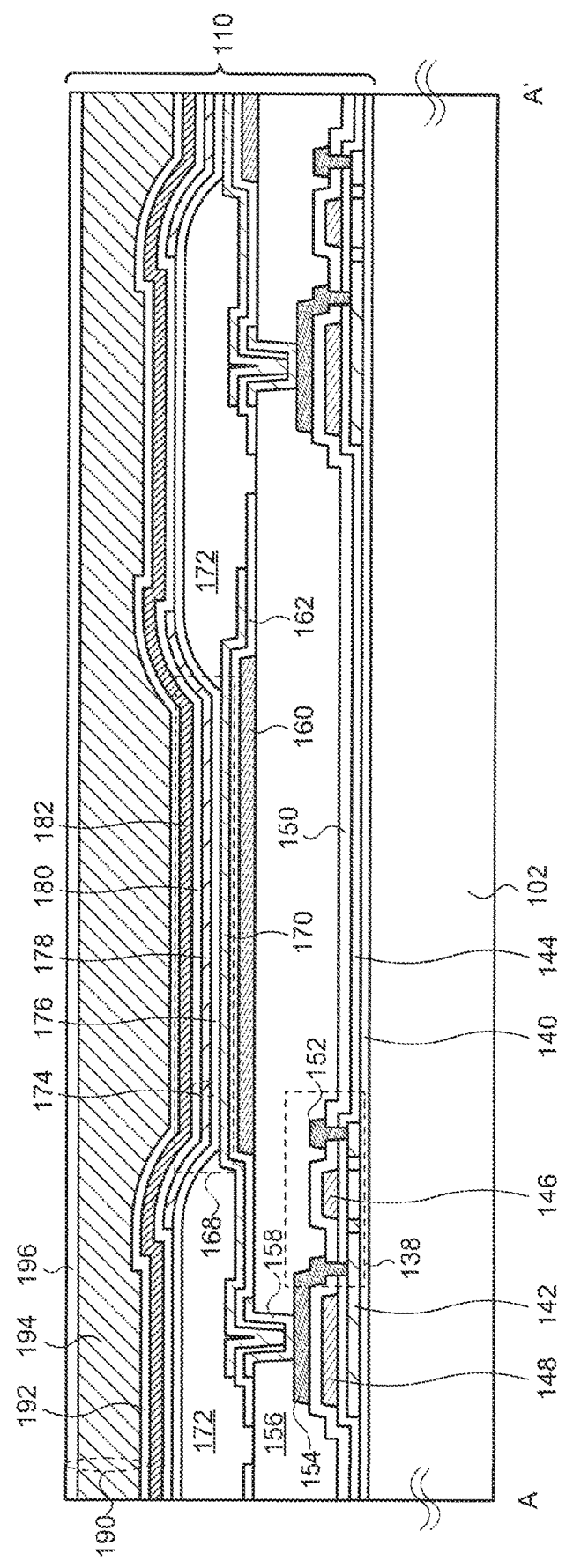
FIG. 5 is a schematic cross-sectional view of a display device according to an embodiment of the present invention.

The structure of the display device 100 is explained using a schematic cross-sectional view. A schematic cross-sectional view along a chain line A-A' in FIG. 4 is shown in FIG. 5. Here, a cross-sectional view of the substrate 102 and the display unit 110 is illustrated using the pixel 112 having a light-emitting element 168 as an example. The structure of the display element is not limited, and the display element may be a voltage-driving type element such as a liquid crystal element and an electrophoretic element. One pixel 112 and a part of the pixel 112 adjacent thereto are demonstrated in the cross-sectional view. Although a structure is illustrated in which one transistor 138, one storage capacitor, and one supplemental capacitor are provided to each pixel 112 as explained below, each pixel 112 may include a plural number of these semiconductor elements.

The substrate 102 has a function to support the display unit 110 as well as the barrier layer 200 and the touch sensor 300 provided thereover and may include glass, quartz, ceramics, or a polymer, for example. A polymer having flexibility may be used for the substrate 102, by which flexibility can be provided to the display device 100.

As shown in FIG. 5, a variety of patterned insulating layers, semiconductor layers, and conductive layers are arranged in the display unit 110 by which the pixels 112, the driver circuits 116, and the like are formed. For example, an undercoat 140 may be disposed in the display unit 100 so as to be in contact with the substrate 102. The undercoat 140 has a function to prevent diffusion of impurities included in the substrate 102, such as alkaline metal ions, to the transistor 138 and the like and may include an inorganic compound containing silicon. As an inorganic compound containing silicon, silicon oxide, silicon nitride, silicon oxynitride, silicon nitride oxide, and the like are represented. The undercoat 140 may have a single-layer structure or a structure in which a plurality of compounds selected from the aforementioned inorganic compounds is stacked.

The transistor 138 may be arranged over the undercoat 140. The transistor 138 possesses, as a fundamental structure, a semiconductor layer 142, a gate electrode 146, a gate insulating layer 144 sandwiched between the semiconductor layer 142 and the gate electrode 146, an interlayer film 150, and source/drain electrodes 152 and 154 electrically connected to the semiconductor layer 142.

The semiconductor layer 142 may include a Group 14 element such as silicon or an oxide semiconductor. As an oxide semiconductor, an oxide including a Group 13 element, such as a mixed oxide (IZO) of indium and gallium and a mixed oxide (IGZO) of indium, gallium, and zinc, can be used. There is no limitation to the crystallinity of the semiconductor layer 142, and the semiconductor layer 142 may have a single-crystalline, polycrystalline, microcrystalline, or amorphous morphology. Moreover, these morphologies may be mixed in one semiconductor layer 142.

The gate insulating layer 144 is also an insulating layer and may include an inorganic compound containing silicon. The gate insulating layer 144 may also have a single-layer structure or a stacked-layer structure.

The gate electrode 146 has a function to generate carriers in the semiconductor layer 142 when a voltage is applied thereto, by which on/off of the transistor 138 is controlled. The gate electrode 146 includes a metal such as titanium, aluminum, copper, molybdenum, tungsten, and tantalum or an alloy thereof and may be formed to have a single-layer or stacked-layer structure. For example, a structure may be employed in which a metal with high conductivity, such as aluminum or copper, is sandwiched by a metal with a relatively high melting point, such as titanium, tungsten, or molybdenum. The wirings 118 and the terminals 120 and 122 may be formed simultaneously with the gate electrode 146. In this case, these wirings 118, the terminals 120 and 122, and the gate electrode 146 exist in the same layer.

The interlayer film 150 is provided over the gate electrode 146. The interlayer film 150 is also an insulating layer and may include an inorganic compound containing silicon, similar to the gate insulating layer 144. The interlayer film 150 may also have a single-layer structure or a stacked-layer structure.

The source/drain electrodes 152 and 154 are electrically connected to the semiconductor layer 142 in opening portions formed in the gate insulating layer 144 and the interlayer film 150. The source/drain electrodes 152 and 154 also may include a metal usable for the gate electrode 146 and are formed in a stacked-layer structure or a single-layer structure. The wirings 118 and the terminals 120 and 122 may be fabricated at the same time as the source/drain electrodes 152 and 154. In this case, these wirings 118, the terminals 120 and 122, and the source/drain electrodes 152 and 154 exist in the same layer.

The structure of the transistor 138 is not limited, and the transistor 138 may have a top-gate structure shown in FIG. 5 or a bottom-gate structure. Alternatively, the gate electrode 146 may be provided both over and under the semiconductor layer 142. It is also possible to use a transistor having a so-called multi-gate structure in which a plurality of gate electrodes 146 overlaps with one semiconductor layer 142.

The display unit 110 may further possess the capacitor electrode 148 overlapping with the semiconductor layer 142 and the source/drain electrode 154 and sandwiched therebetween. The capacitor electrode 148 may be simultaneously formed with the gate electrode 146 and may be integrated with the gate electrode 146. The storage capacitor is formed with the semiconductor layer 142, the gate insulating layer 144, the capacitor electrode 148, the interlayer film 150, and the source/drain electrode 154 and contributes to maintenance of the potential of the gate electrode 146.

The display unit 110 may further include a leveling layer 156 over the transistor 138. The leveling layer 156 has a function to absorb depressions and projections caused by the transistor 138, the storage capacitor, and the like and provide a flat surface. The leveling layer 156 is also an insulating layer and can be formed with an organic compound. As an organic compound, a polymer material such as an epoxy resin, an acrylic resin, and a polysiloxane is represented. Although not illustrated, an insulating layer including an inorganic compound such as silicon nitride, silicon nitride oxide, silicon oxynitride, and silicon oxide may be formed under or over the leveling layer 156.

An opening portion is provided to the leveling layer 156 in order to electrically connect the transistor 138 and the light-emitting element 168 to each other. As shown in FIG. 5, a connection electrode 158 electrically connected to the source/drain electrode 154 may be disposed in this opening portion. The connection electrode 158 may be formed by using a conductive oxide capable of transmitting visible light.

As an optional structure, a supplementary capacitor electrode 160 and an insulating layer 162 covering the supplementary capacitor electrode 160 may be provided in the display unit 110. The supplementary capacitor electrode 160 is disposed over the leveling layer 156. The insulating layer 162 can be formed so as to cover the connection electrode 158 in addition to the supplementary capacitor electrode 160 but does not cover a part of a top surface of the connection electrode 158 to expose the connection electrode 158. The structure allows the top surface of the connection electrode 158 to be electrically connected to a first electrode 170 of the light-emitting element 168.

The supplementary capacitor is formed with the supplementary capacitor electrode 160, the insulating layer 162, and the first electrode 170 of the light-emitting element 168 arranged thereover. That is, the insulating layer 162 functions as a dielectric film. The supplementary capacitor electrode may be electrically connected to the gate electrode 146 of the transistor 138, thereby contributing to maintenance of the potential between the source/drain electrode 154 and the gate electrode 146.

The supplementary electrode 160 may include a metal or an alloy usable in the gate electrode 146 and the source/drain electrodes 152 and 154 and may be formed so as to have a single-layer structure or a stacked-layer structure. Similar to the undercoat 140, the insulating layer 162 includes an inorganic compound containing silicon and may be prepared so as to have a single-layer structure or a stacked-layer structure. Note that the wirings 118, the terminals 120 and 122, and the supplementary capacitor electrode 160 may be simultaneously formed to exist in the same layer.

The light-emitting element 168 is structured by the first electrode 170 electrically connected to the connection electrode 158, an EL layer 174 over the first electrode 170, and a second electrode 182 over the EL layer 174. In the present specification and claims, the EL layer 174 means all of the layers sandwiched between the first electrode 170 and the second electrode 182 and corresponds to a layer to which carriers are injected from the first electrode 170 and the second electrode 182.

When light-emission from the light-emitting element 168 is extracted from the second electrode 182, the first electrode 170 is configured to reflect visible light. In this case, a metal with a high reflectance, such as silver and aluminum, or an alloy thereof is used for the first electrode 170. Alternatively, a film of a conductive oxide having a light-transmitting property is formed over a film including the metal or alloy. When the light-emission from the light-emitting element 168 is extracted from the first electrode 170, the first electrode 170 may be fabricated by using a conductive oxide having a light-transmitting property.

The display unit 110 may further possess a partition wall 172 covering an edge portion of the first electrode 170. With the partition wall 172, the steps caused by the first electrode 170 and the like can be absorbed, and the first electrodes 172 of adjacent pixels 112 can be electrically insulated. The partition wall 170 covers the edge portion of the first electrode 170, which prevents disconnection of the EL layer 174 and the second electrode 182 formed thereover. The partition wall 172 is also an insulating layer and may include a polymer such as an epoxy resin, an acrylic resin, a polyimide, a polyamide, and a polysiloxane.

The EL layer 174 includes an organic compound and is provided so as to overlap with the first electrode 170 and the partition wall 172. The structure of the EL layer 174 can be arbitrarily determined, and the EL layer 174 may be structured with a plurality of layers with different functions. For example, the EL layer 174 may be formed by appropriately combining a carrier-injection layer, a carrier-transporting layer, an emission layer, a carrier-blocking layer, an exciton-blocking layer, and the like. One layer may have a plurality of functions. An example is shown in FIG. 5 in which the EL layer 174 includes a hole-injection/transporting layer 176, an emission layer 178, and an electron-injection/transporting layer 180. When the structure or material of the emission layer 178 is varied between adjacent pixels 112, emission colors different between adjacent pixels 112 can be obtained. In this case, the hole-injection/transporting layer 176 and the electron-injection/transporting layer 180 are shared by adjacent pixels 112 and may be in contact with each other over the partition wall 172.

The second electrode 182 is formed over the EL layer 174. The second electrode 182 may be formed across the plurality of pixels 112 so as to be shared by the plurality of pixels 112. When the light-emission from the light-emitting element 168 is extracted from the first electrode 170, a metal such as aluminum, magnesium, and silver or a metal thereof (e.g., Mg—Ag) may be used for the second electrode 182. In contrast, when the light-emission from the light-emitting element 168 is extracted from the second electrode 182, a conductive oxide having a light-transmitting property, such as ITO, may be used for the second electrode 182. Alternatively, a film of the metal described above may be formed to have a thickness which permits visible light to pass therethrough. In this case, a conductive oxide with a light-transmitting property may be further stacked thereover.

The display unit 110 further possesses a sealing film (passivation film) 190 over the light-emitting element 168. The passivation film 190 has a function to prevent impurities (water, oxygen, and the like) from entering the light-emitting element 168 and the transistor 138 from outside. The passivation film 190 may have a single-layer structure of an inorganic compound containing silicon, for example. Alternatively, the passivation film 190 may include three layers (a first layer 192, a second layer 194, and a third layer 196) as shown in FIG. 5. In this case, an inorganic compound containing silicon can be used in the first layer 192 and the third layer 196, for example. On the other hand, a polymer such as an epoxy resin, an acrylic resin, or a polyimide may be used in the second layer 194. The second layer 194 may be formed so as to absorb depressions and projections caused by the light-emitting element 168 and the partition wall 172 and to provide a flat surface.

In the present specification and the claims, the display unit 110 means the passivation film 190 and the plurality of films located between the passivation film 190 and the substrate 102.

5-2. Structure of Edge Portions of Substrate

Figure 6:
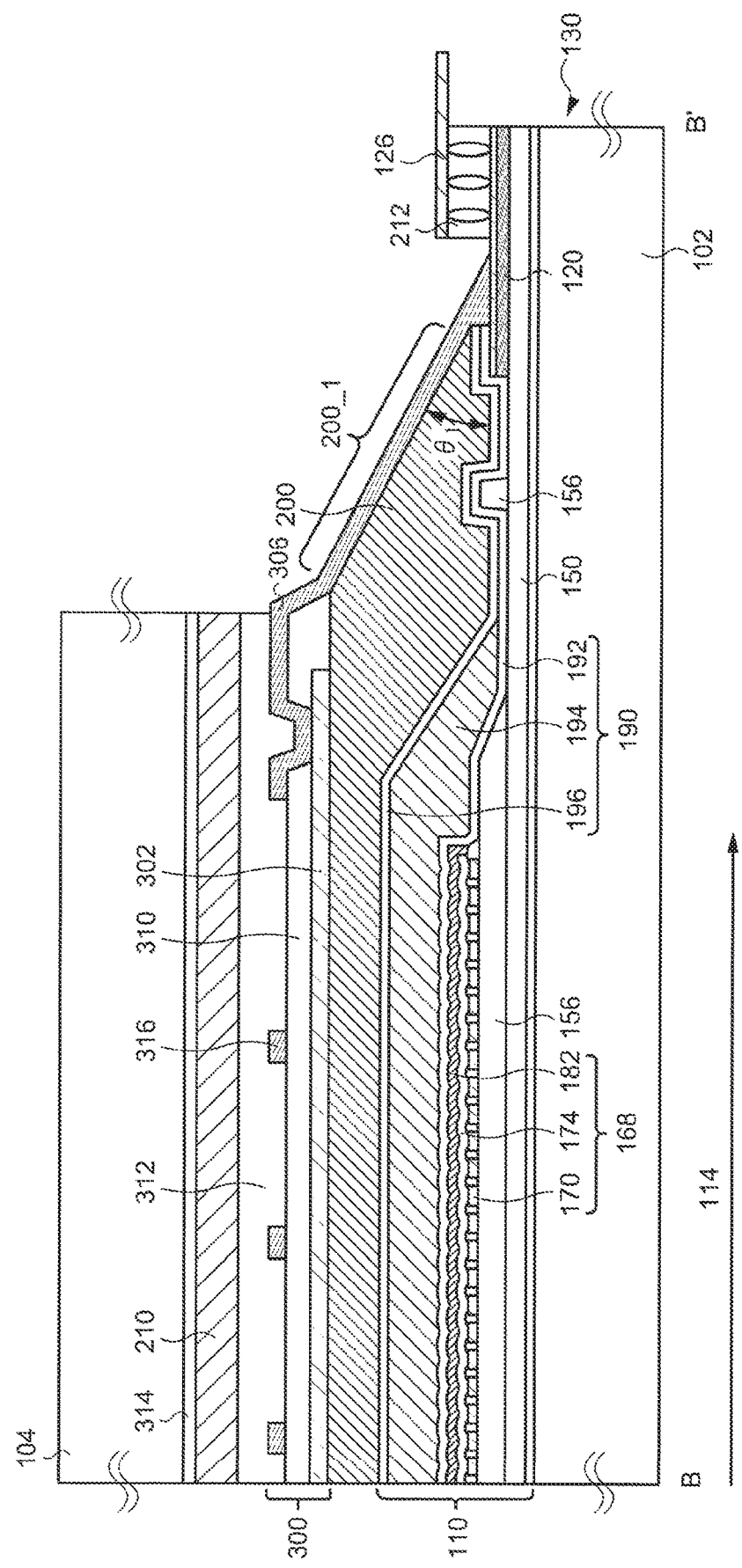
FIG. 6 is a schematic cross-sectional view of a display device according to an embodiment of the present invention.
Figure 7:
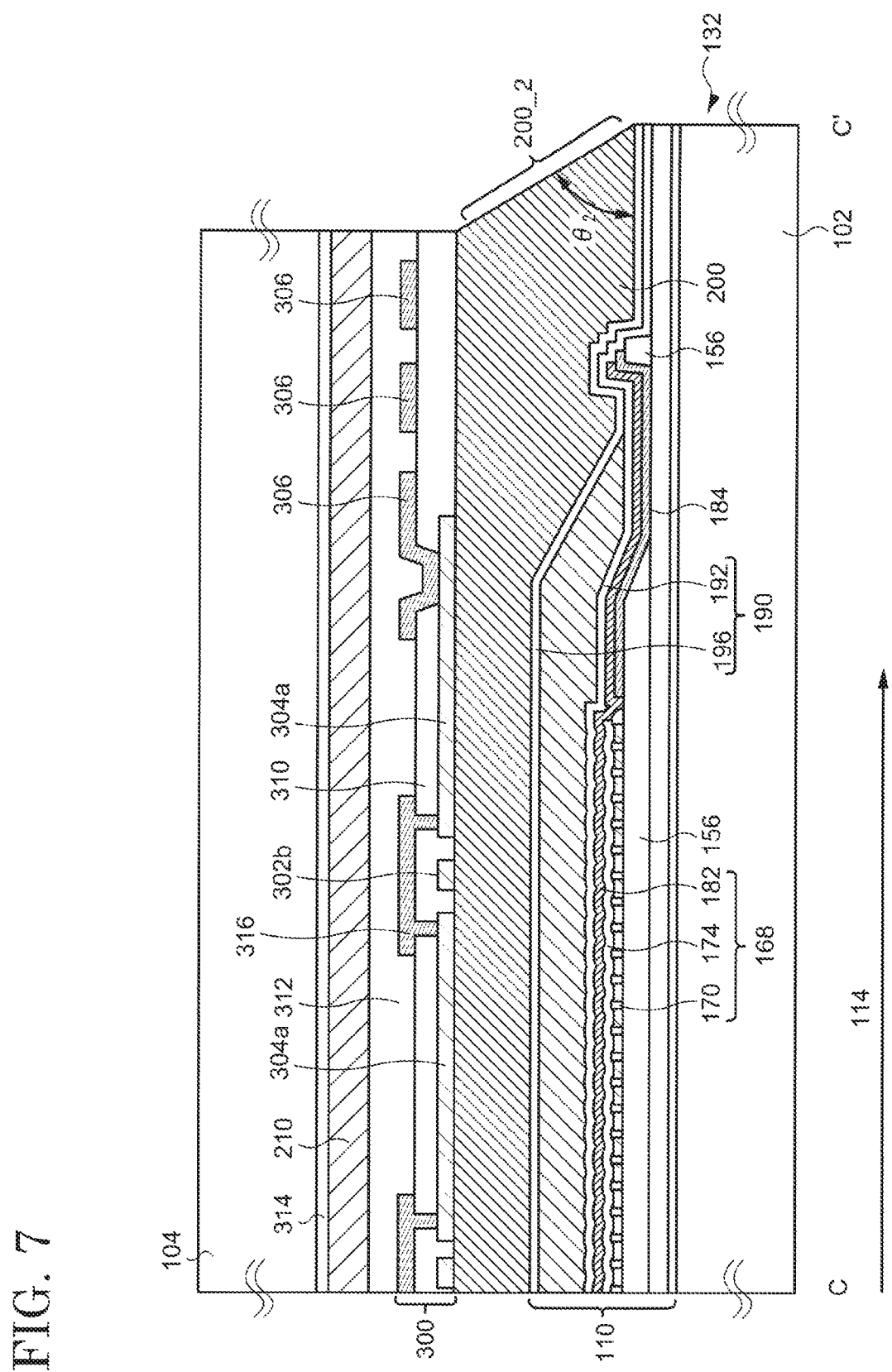
FIG. 7 is a schematic cross-sectional view of a display device according to an embodiment of the present invention.

Schematic cross-sectional views along chain lines B-B' and C-C' in FIG. 2 are shown in FIG. 6 and FIG. 7, respectively. The detailed structures of the display unit 110 are not illustrated for promoting understanding.

Power-Source Line

As shown in FIG. 7, a power-source line 184 for supplying a constant potential to the second electrode 182 is arranged between the display region 114 and the edge portion of the substrate 102 (here, the second side 132) in the display unit 110. The second electrode 182 is electrically connected to the power-source line 184. Although not illustrated, the power-source line 184 may also be disposed between the display region 114 and the fourth side 136 or between the display region 114 and the third side 134.

Water-Shielding Structure

As shown in FIG. 6 and FIG. 7, the display unit 110 may be configured so that the interlayer film 150 (alternatively, an insulating layer including an inorganic compound and provided under the leveling layer 156) and the first layer 192 directly contacts with each other by removing a part of the leveling layer 156 in a region between the edge portions of the substrate 102 (here, the first side 130 and the second side 132) and the display region 114. Such a structure is also called a water-shielding structure and prevents the leveling layer 156 from being exposed at the edge portions of the substrate 102. The polymer usable in the leveling layer 156 has a higher hydrophilicity compared with an inorganic compound including silicon. Hence, when the leveling layer 156 is exposed at the edge portions of the substrate 102, water enters the leveling layer 156 from outside. In this case, the leveling layer 156 serves as a water-transporting path because the leveling layer 156 extends to the display region 114. As a result, water enters the display region 114. A display element such as the light-emitting element 168 is rapidly deteriorated when operated in the presence of water, leading to reduction of reliability of the display device 100. However, the use of the water-shielding structure prevents water from entering from outside, thereby increasing reliability of the display device 100.

Terminal

As described above, the terminals 120 and 122 can be simultaneously formed with the gate electrode 146, the source/drain electrodes 152 and 154, or the supplementary capacitor electrode 160. Additionally, the terminals 120 may have a stacked-layer structure as shown in FIG. 6. Although not illustrated in FIG. 6, the terminals 122 also may have a stacked-layer structure. In this case, it is possible to employ a structure where a metal film which exists in the same layer as the gate electrode 146, the source/drain electrodes 152 and 154, or the supplementary electrode 160 and a film of a conductive oxide which exists in the same layer as the connection electrode 158 or the first electrode 170 are stacked, for example. The terminals 120 and 122 are electrically connected to the connector 126 by using an adhesive with conductivity, such as an anisotropic conductive layer 212.

Passivation Film

As shown in FIG. 6 and FIG. 7, the second layer 194 of the passivation film 190 is sandwiched by the first layer 192 and the third layer 196, and the first layer 192 and the third layer 196 are in contact with each other between the edge portions of the substrate 102 and an outer edge of the display region 114. As shown in FIG. 6, the first layer 192 may be in contact with the terminals 120 (and terminals 122). Although not illustrated, the third layer 196 may be in contact with the terminals 120 and 122 between a side surface of the first layer 192 and the first side 130.

Touch Sensor

The first touch electrodes 302 of the touch sensor 300 are provided over the barrier layer 200. Here, an example is shown where the first touch electrodes 302 and the second touch electrodes 304 exist in the same layer, and an insulating layer 310 is arranged so as to cover the first touch electrodes 302 and the second touch electrodes 304. The insulating layer 310 functions as a dielectric film and forms a capacitance in association with the first touch electrodes 302 and the second touch electrodes 304. The insulating layer 310 may include an inorganic compound containing silicon or a polymer such as an acrylic resin and an epoxy resin.

The bridge electrodes 316 are formed over the insulating layer 310 to electrically connect adjacent diamond electrodes 304a. Opening portions reaching the first touch electrodes 302 or the second touch electrodes 304 are provided in insulating layer 310, and the wirings 306 are disposed so as to fill these opening portions. The wirings 306 cross a sidewall of the barrier layer 200, extend in a direction toward the first side 130, and are electrically connected to the terminals 120. Therefore, the wirings 306 may be in contact with the barrier layer 200. The wirings 306 may include a metal such as aluminum, molybdenum, tungsten, titanium, and copper or an alloy thereof and may exist in the same layer as the bride electrodes 316.

Barrier Layer

The barrier layer 200 is provided so as to cover the first layer 192 and the third layer 196 and contact with the terminals 120 between the first side 130 and the display region 114. Although not illustrated, the barrier layer 200 may be in contact with the terminals 122.

Here, the barrier layer 200 can be configured so that the slope of a sidewall (first sidewall) 200_1 of the barrier layer 200 along the first side 130 is relatively gentle. More specifically, the barrier layer 200 may be arranged so that an angle (first angle) $\theta_1$ between the first sidewall 200_1 and a top surface of the substrate 102 is larger than 0° and equal to or smaller than 5° or equal to or larger than 1° and equal to or smaller than 3°. Adjustment of the first angle $\theta_1$ in this range prevents disconnection of the wirings 306 extending over the first sidewall 200_1, which enables production of the display device 100 having high reliability.

On the other hand, the barrier layer 200 may be fabricated so that the slope of a sidewall (second sidewall) 200_2 formed along the second side 132 is different from that of the first sidewall 200_1 as shown in FIG. 7. That is, the barrier layer 200 may be formed so that an angle (second angle) $\theta_2$ between the second sidewall 200_2 and the top surface of the substrate 102 is different from $\theta_1$. The second angle $\theta_2$ may be larger than the first angle $\theta_1$. For example, the second angle $\theta_2$ may be adjusted to be equal to or larger than 20° and equal to or smaller than 60°, equal to or larger than 20° and equal to or smaller than 45°, or equal to or larger than 20° and equal to or smaller than 30°. Provision of such a large angel to the second sidewall 200_2 allows a distance between the display region 114 and the second side 132 to be reduced, allowing an area of the display region 114 to be increased.

As shown in FIG. 4, similar to the first side 130 and the second side 132, the barrier layer 200 possesses sidewalls (a third sidewall 200_3 and a fourth sidewall 200_4) along the third side 134 and the fourth side 136, respectively. Therefore, the display region 114 overlaps with a region surrounded by the first sidewall 200_1 to the fourth sidewall 200_4. The barrier layer 200 may be configured so that an angle (third angle) between the third sidewall 200_3 and the top surface of the substrate 102 and an angle (fourth angle) between the fourth sidewall 200_4 and the top surface of the substrate 102 are larger than the first angle $\theta_1$ and the same or substantially the same as the second angle $\theta_2$.

Figure 8A:
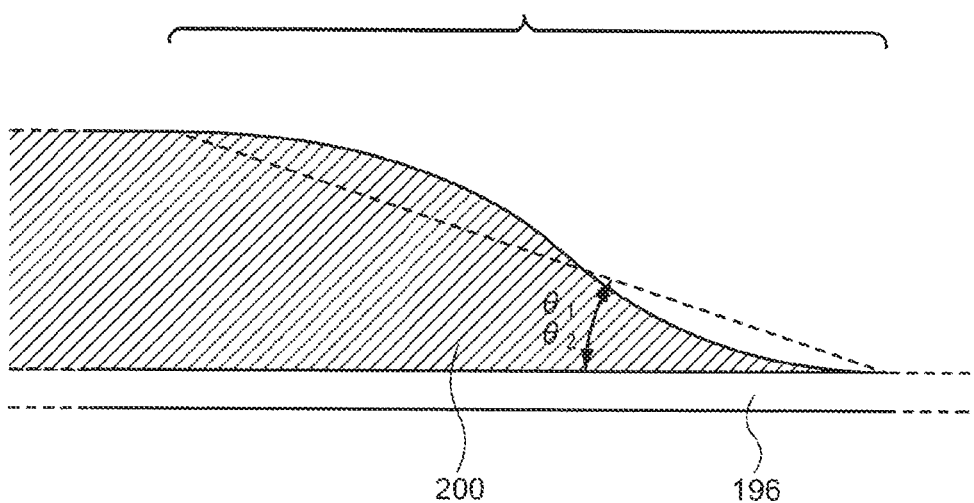
FIG. 8A to FIG. 8C are schematic cross-sectional views of a display device according to an embodiment of the present invention.
Figure 8B:
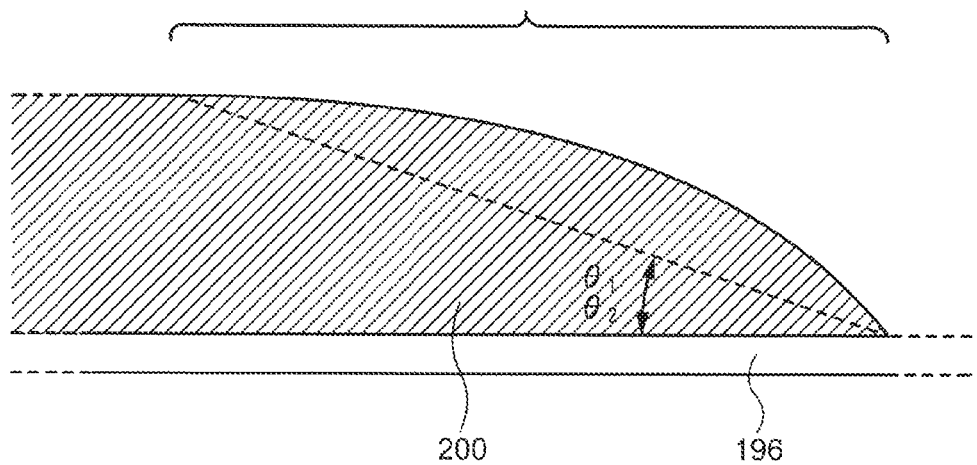
Figure 8C:
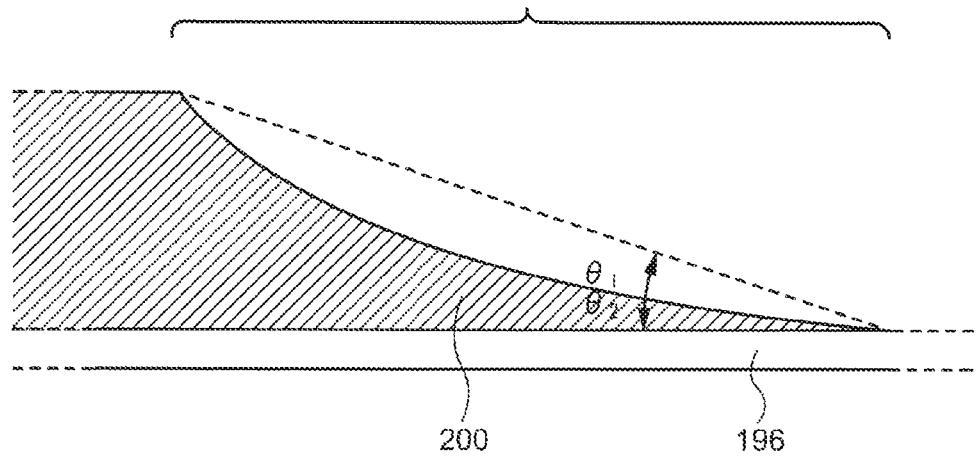

An example is demonstrated in FIG. 6 and FIG. 7 in which the sidewalls of the barrier layers 200 are structured by flat planes. However, the barrier layer 200 may be structured so that a cross section of the sidewall is expressed by a curve as shown in FIG. 8A to FIG. 8C. In this case, the curve may have an inflection point as shown in FIG. 8A or may not have any inflection point as shown in FIG. 8B and FIG. 8C. In the case where the curve does not have any inflection point, the curve may be convex upward or downward. When the cross section of the sidewall is expressed by a curve, the first angle $\theta_1$ and the second angle $\theta_2$ may be defined as an angle between a straight line passing through an edge portion of the barrier layer 200 (an edge portion closer to the edge portion of the substrate 102 than the display region 114. Hereinafter, the same is applied to the present specification and the claims) and an edge portion of a flat surface of the barrier layer 200 (an edge portion closer to the edge portion of the substrate 102 than the display region 114. Hereinafter, the same is applied to the present specification and the claims) and the top surface of the substrate 102 in the cross section thereof.

5-3. Other Structures

A protection film 312 may be formed as an optional structure so as to cover the first touch electrodes 320, the second touch electrodes 304, and the bridge electrodes 316. The protection film 312 may include an inorganic compound containing silicon or a polymer such as an epoxy resin or an acrylic resin. Furthermore, the polarizing plate 210 may be arranged, as an optional structure, over the touch sensor 300 with the protection film 312 interposed therebetween. The polarizing plate 210 may be a linear polarizing plate or a circular polarizing plate. The use of a circular polarizing plate allows external light reflected in the touch sensor 300 and the display unit 110 to be blocked, leading to an increase in display quality. The opposing substrate 104 is disposed over the polarizing plate 210 with an adhesive layer 314 sandwiched therebetween. The polarizing plate 210 may be arranged over the opposing substrate 104.

As described above, the display elements (light-emitting elements 168) of the display device 100 are protected by the passivation film 190, and the touch sensor 300 is fabricated over the passivation film 190. The first touch electrodes 302 and the second touch electrodes 304 of the touch sensor 300 are formed by preparing a conductive film with a sputtering method or a chemical vapor deposition (CVD) method, followed by performing etching processing. The passivation film 190 includes a film (e.g., the third layer 196) containing an inorganic compound. It is not always easy to prepare a film including an inorganic compound uniformly and densely over the whole of the substrate 102. Thus, if the third layer 196 includes a pinhole and the like, for example, an etchant, a cleaning solution, or the like enters as an impurity through the pinhole when the first touch electrodes 302 are prepared, and the sealing structure is broken. Deterioration of the light-emitting elements 168 by impurities results in a decrease in emission efficiency, which eventually inhibits light-emission from the light-emitting elements 168. A pixel 112 having a light-emitting element 168 from which light-emission is not attainable is observed as a black spot (dark spot), which exerts a fatal influence to display quality of the display device 100.

However, formation of the barrier layer 200 allows the third layer 196 to be protected. For example, a pinhole formed in the third layer 196 can be effectively filled by preparing the barrier layer 200 with a polymer soluble in an organic solvent. Therefore, it is possible to prevent the seal provided by the passivation film 190 from being broken by impurities when the touch sensor 300 is fabricated, leading to an increase in reliability of the display device 100.

Additionally, the gentle slope of the first sidewall 200_1 of the barrier layer 200 prevents disconnection of the wirings 306. Furthermore, the slopes of the second sidewall 200_2, the third sidewall 200_3, and the fourth sidewall 200_4 respectively arranged along the second side 132, the third side 134, and the fourth side 136 are set to be steeper than that of the first sidewall 200_1, by which a frame can be narrowed. Hence, implementation of the present embodiment enables production of the highly reliable display device 100 in which the broad display region 114 is secured.

Second Embodiment

In the present embodiment, an example of a manufacturing method of the display device 100 is explained by using FIG. 9A to FIG. 23. FIG. 9A to FIG. 11B and FIG. 13A to FIG. 14B are each a part of the cross section in FIG. 5, FIG. 12A, FIG. 15A, and FIG. 19B to FIG. 23 correspond to the cross section along the chain line B-B' in FIG. 2, and FIG. 12B, FIG. 15B, FIG. 17A to FIG. 17D, and FIG. 19A correspond to the cross section along the chain line C-C' in FIG. 2. An explanation of the contents the same as those of the First Embodiment may be omitted.

1. Display Unit

First, the undercoat 140 is formed over the substrate 102 with a CVD method, a sputtering method, or the like as shown in FIG. 9A. When a stacked-layer structure is applied to the undercoat 140, a structure can be employed in which a film containing silicon nitride is sandwiched by films containing silicon oxide, for example. When an impurity concentration in the substrate 102 is low, the undercoat 140 may not be formed or may be formed so as to cover only a part of the substrate 102.

Next, the semiconductor layer 142 is formed over the undercoat 140 (FIG. 9A). When the semiconductor layer 142 includes silicon, the semiconductor layer 142 can be formed with a CVD method using a silane gas or the like as a raw material. Crystallization may be conducted on the obtained amorphous silicon by performing a heating treatment or irradiation with light such as a laser light. When the semiconductor layer 142 includes an oxide semiconductor, the semiconductor layer 142 can be formed by utilizing a sputtering method.

Next, doping is performed. Doping may be carried out several times, and the following procedure may be employed, for example. First, a first doping is performed on the semiconductor layer 142 to form doped regions 142_2 and an undoped region 142_1 (FIG. 9B). Specifically, a resist film 164 is formed over a portion in which the undoped region 142_1 is to be formed, and then the semiconductor layer 142 is doped with ions (FIG. 9A). Ions of phosphorus or nitrogen imparting a n-type conductivity can be used, for example. After that, the resist film 164 is removed.

Next, the gate insulating layer 144 is formed so as to cover the semiconductor layer 142 (FIG. 9B). The gate insulating layer 144 may be formed with a CVD method, a sputtering method, or the like.

Next, the gate electrode 146 and the capacitor electrode 148 are formed over the gate insulating layer 144 with a sputtering method or a CVD method (FIG. 9B). The gate electrode 146 is prepared so as to overlap with the undoped region 142_1.

Figure 10A:
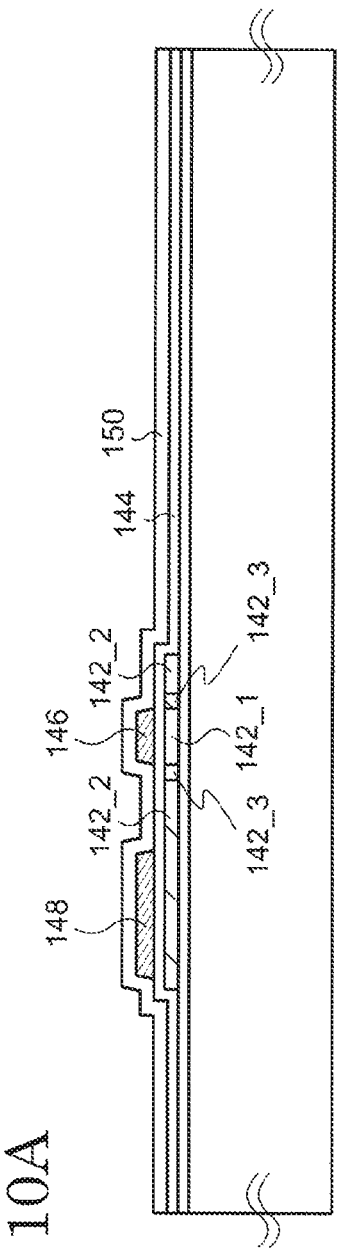
FIG. 10A and FIG. 10B are schematic cross-sectional views for explaining a manufacturing method of a display device according to an embodiment of the present invention.

Next, a second doping is conducted on the semiconductor layer 142 using the gate electrode 146 as a mask (FIG. 10A). Doping conditions at this time are adjusted so that the semiconductor layer 142 is doped at a lower concentration compared with the first doping. With this procedure, low-concentration doped regions 142_3 are formed in the regions of the undoped region 142_1 which do not overlap with the gate electrode 146. The concentration of the impurities in the low-concentration doped regions 142_3 is lower than that of the doped regions 142_2. The undoped region 142_1 overlapping with the gate electrode 146 is a region in which no doping with impurities is performed or substantially no doping is performed and functions as a channel region. Note that, when the semiconductor layer 142 includes an oxide semiconductor, the doping process described above may not be performed.

Figure 10B:
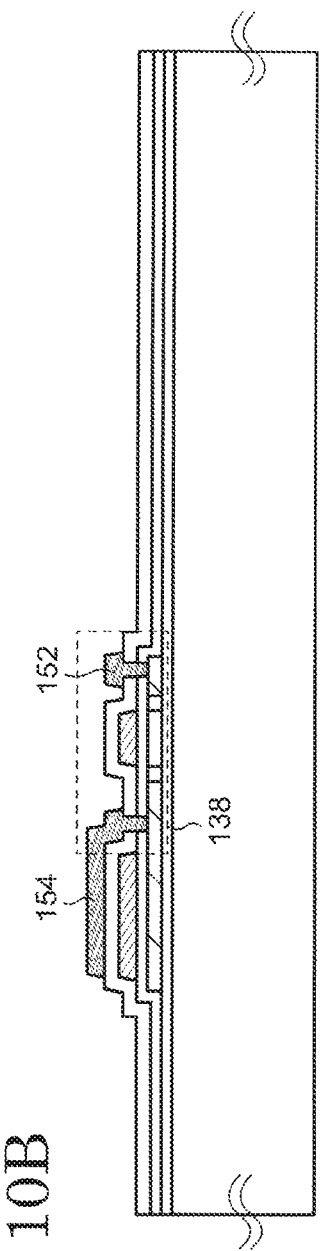

Next, the interlayer film 150 is formed over the gate electrode 146 and the capacitor electrode 148 (FIG. 10A). After that, etching is conducted on the interlayer film 150 and the gate insulating layer 144 to form the opening portions reaching the doped regions 142_2. The etching can be carried out in a gas including a fluorine-containing hydrocarbon in the presence of plasma. A metal film is formed with a sputtering method or a CVD method so as to cover these opening portions and is processed with etching, resulting in the formation of the source/drain electrodes 152 and 154 (FIG. 10B). With this process, the transistor 138 is fabricated. The terminals 120 and 122 may be simultaneously prepared when the source/drain electrodes 152 and 154 are formed.

Next, the leveling layer 156 is formed (FIG. 11A). The leveling layer 156 can be formed with the aforementioned wet-type film-formation method or the like. When the leveling layer 156 has a stacked-layer structure including a layer containing a polymer and a layer containing an inorganic compound, the layer including an inorganic compound can be formed with a sputtering method or a CVD method.

Next, the leveling layer 156 is subjected to etching to form the opening portion reaching the source/drain electrode 154 (FIG. 11B). At this time, the water-shielding structure is constructed by removing a part of the leveling layer 156 in the periphery of the display region 114, that is, in the region between the display region 114 and the edge portions of the substrate 102 (the first side 130, the second side 132, the third side 134, and the fourth side 136) so as to expose the interlayer film 150 as shown in FIG. 12A and FIG. 12B.

Figure 13A:
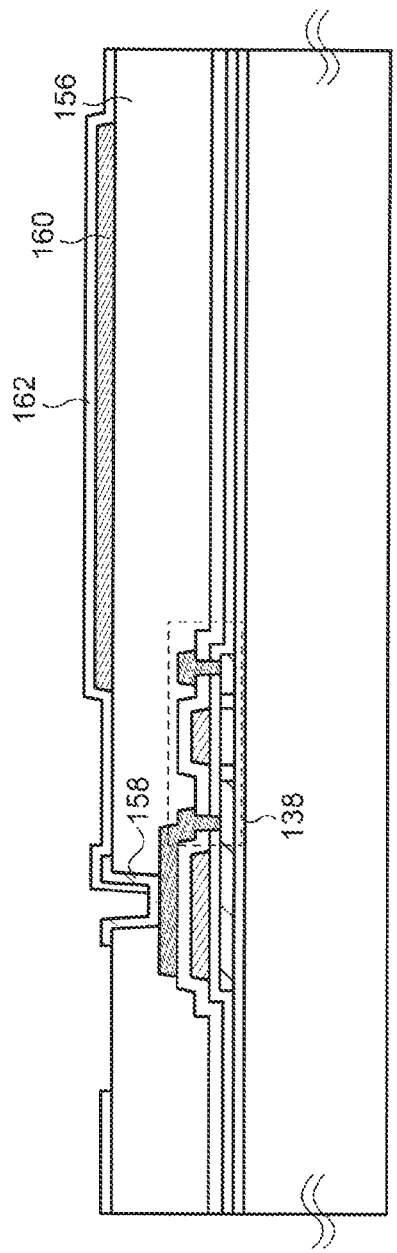
FIG. 13A and FIG. 13B are schematic cross-sectional views for explaining a manufacturing method of a display device according to an embodiment of the present invention.

After that, the connection electrode 158 is formed so as to cover the opening portion (FIG. 13A). The connection electrode 158 can be prepared by conducting sputtering on a target including a conductive oxide such as ITO and IZO. At this time, surfaces of the terminals 120 and 122 may be covered with ITO or IZO (see FIG. 15A). It is not always necessary to perform this process. However, this process enables protection of an exposed surface of a metal, such as surfaces of the source/drain electrode 154 and the terminals 120 and 122 in the following processes, which prevents increase in contact resistance.

Next, the supplementary capacitor electrode 160 is formed, which is followed by the formation of the insulating layer 162 (FIG. 13A). These items can be formed with a CVD method or a sputtering method. As an optional structure, an opening portion may be provided to the insulating layer 162 to allow the partition wall 172 formed later and the leveling layer 156 to be in contact with each other. With this opening portion, impurities such as water eliminated from the leveling layer 156 can be released during the manufacturing process of the display device 100.

Figure 13B:
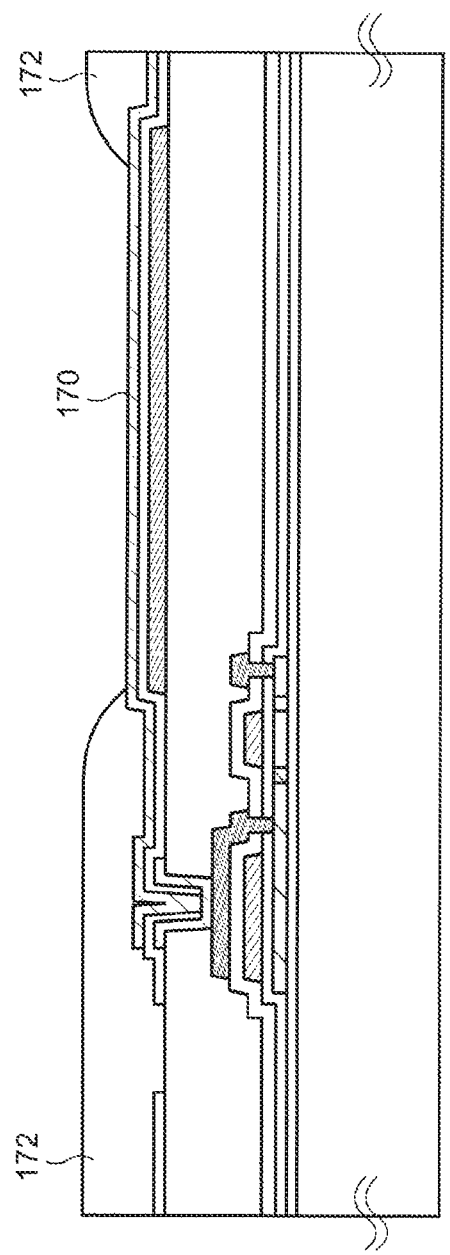

Next, the first electrode 170 of the light-emitting element 168 is formed with a sputtering method or a CVD method, and then the partition wall 172 is formed (FIG. 13B). The first electrode 170 is provided so that the opening portion formed in the leveling layer 156 is filled and the first electrode 170 is electrically connected to the connection electrode 158. The partition wall 172 can be formed by applying the wet-type film-formation method described above. The partition wall 172 covers the edge portion of the first electrode 170 and possesses an opening portion exposing parts other than the edge portions. This structure prevents a coverage deficiency of the EL layer 174 and the second electrode 182 formed later.

After forming the partition wall 172, the EL layer 174 of the light-emitting element 168 and the second electrode 182 over the EL layer 174 are formed (FIG. 14A). Here, a structure is demonstrated in which the EL layer 174 possesses the hole-injection/transporting layer 176, the emission layer 178, and the electron-injection/transporting layer 180. However, the present embodiment is not limited thereto, and the EL layer 174 having a single-layer structure or a structure including four or more layers may be employed. The EL layer 174 can be formed with an evaporation method, an ink-jet method, a printing method, a spin-coating method, or the like. The second electrode 182 can be formed with an evaporation method, a sputtering method, or the like.

After forming the second electrode 182, the passivation film 190 is prepared over the second electrode 182 (FIG. 14B). The structure of the passivation film 190 may be arbitrarily selected, and an example is shown here in which the passivation film 190 has a three-layer structure of the first layer 192, the second layer 194, and the third layer 196.

The first layer 192 is composed of an inorganic layer such as silicon nitride and may be formed with a CVD method or a sputtering method. As shown in FIG. 14B, the second layer 194 may be formed at a thickness so that depressions and projections caused by the partition wall 172 are absorbed and a flat surface is provided. The second layer 194 may be formed with a wet-type film-formation method such as an ink-jet method. Alternatively, the second layer 194 may be prepared by atomizing or gasifying oligomers serving as a raw material of the polymer described in the First Embodiment under a reduced pressure, spraying the first layer 192 with the oligomers, and then polymerizing the oligomers. The third layer 196 can be formed with the same method as that of the first layer 192.

Figure 15A:
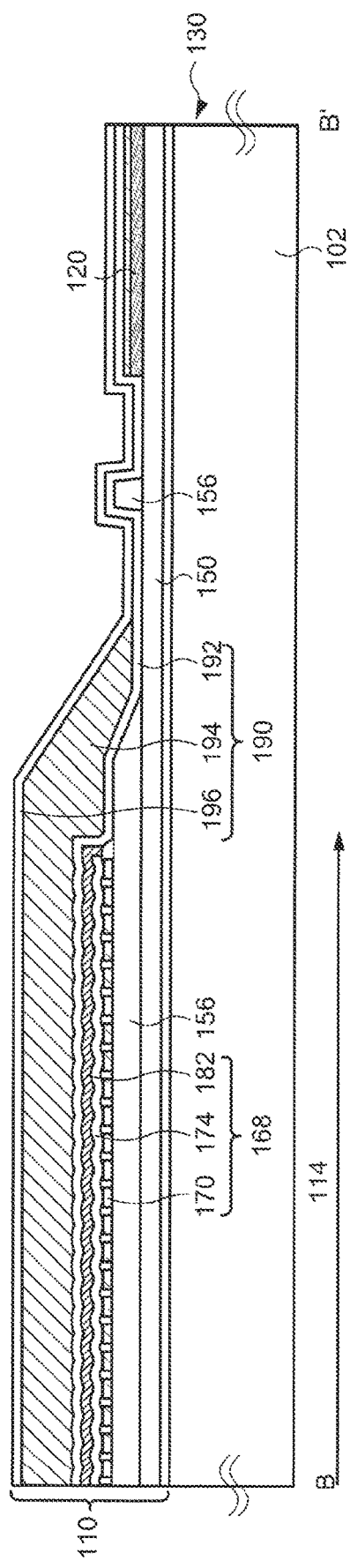
FIG. 15A and FIG. 15B are schematic cross-sectional views for explaining a manufacturing method of a display device according to an embodiment of the present invention.
Figure 15B:
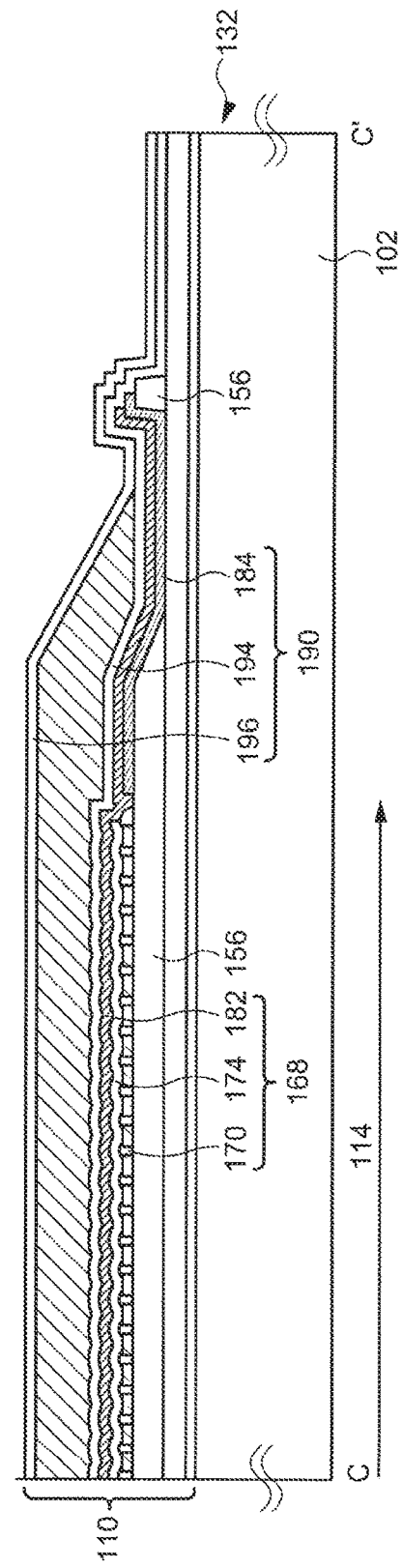

Schematic cross-sectional views of the edge portions of the substrate 102 at this stage are shown in FIG. 15A and FIG. 15B, respectively. As shown in FIG. 15A and FIG. 15B, the first layer 192 and the third layer 196 may be prepared so as to reach the edge portions of the substrate 102, or end portions thereof may be further inside than the edge portions of the substrate 102. A mask shielding the terminals 120 and 122 may not be used during the formation of the first layer 192 and the third layer 196.

Although the second layer 194 covers the display region 114, the second layer 194 is fabricated so that an end portion thereof is located further outside than the display region 114 and further inside than the end portions of the first layer 192 and the third layer 196. Hence, the first layer 192 and the third layer 196 may be in contact with each other between the display region 114 and the edge portions of the substrate 102.

Through the aforementioned processes, the display unit 110 is fabricated.

2. Barrier Layer 200

Figure 16A:
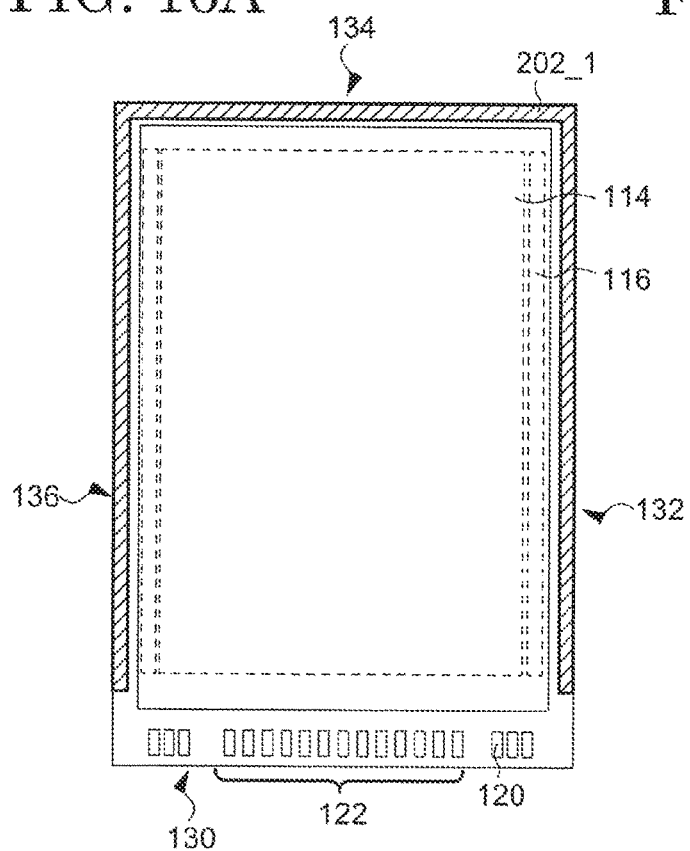
FIG. 16A to FIG. 16D are schematic top views for explaining a manufacturing method of a display device according to an embodiment of the present invention.

Next, the barrier layer 200 is formed over the passivation film 190. Specifically, the barrier layer 200 is formed stepwise by repeating a process including applying a solution containing the polymer described in the First Embodiment and evaporatively removing a solvent in the solution. For example, in a first step, the polymer solution is applied on the edge portions of the substrate 102 so as to be arranged along the second side 132, the third side 134, and the fourth side 136, and then the solvent is evaporatively removed as shown in FIG. 16A. With this step, a rib 202_1 including the polymer is formed. The application of the polymer solution can be carried out by using an ink-jet method or a printing method such as intaglio printing and screen printing. At this time, the drops of the solution are selectively discharged so that the region between the first side 130 along which the terminals 120 and 122 are to be formed and the display region 114 is not applied with the polymer solution.

Figure 17A:
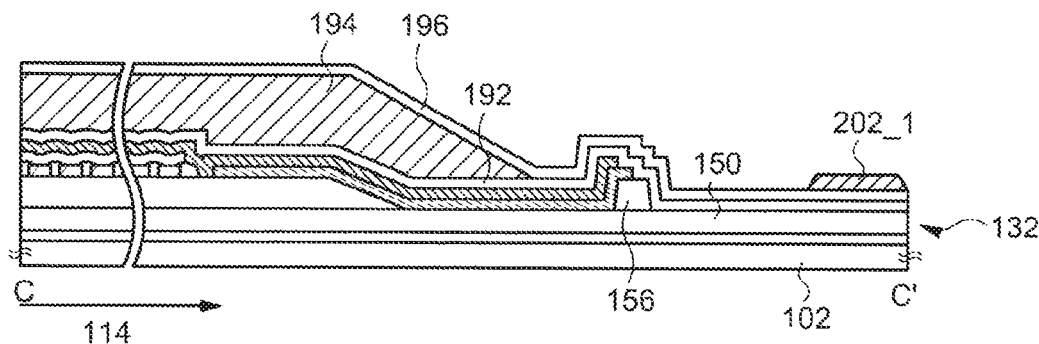
FIG. 17A to FIG. 17D are schematic cross-sectional views for explaining a manufacturing method of a display device according to an embodiment of the present invention.

A schematic cross section at this stage is shown in FIG. 17A. At this stage, an edge of the rib 202_1 may reach the edge portion of the substrate 102. A part of the third layer 196 is covered with the rib 202_1 at the edge portion of the substrate 102, and another part thereof is exposed in a region apart from the second side 132 (that is, between the edge portion of the substrate 102 and the display region 114). Although not illustrated, the same structure is fabricated on the third side 134 and the fourth side 136. Therefore, the rib 202_1 extends along the second side 132, the third side 134, and the fourth side 136 between the edge portions of the substrate 102 and the display region 114 and gives an open shape (e.g., a U-shape) in a plane parallel to the top surface of the substrate 102.

Figure 16B:
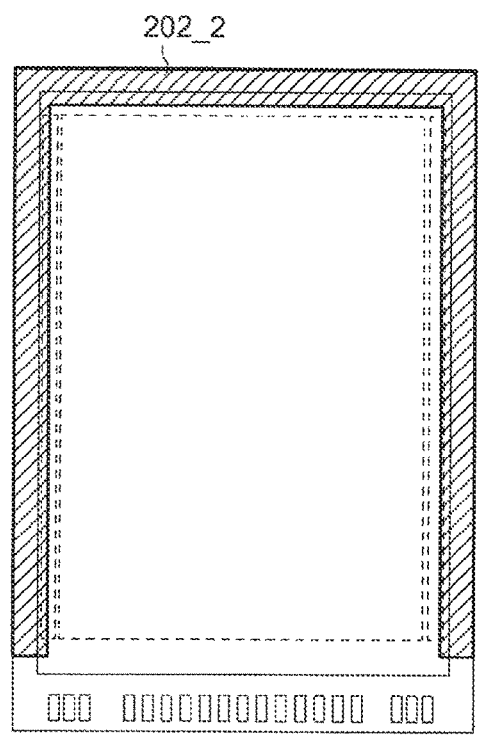
Figure 16C:
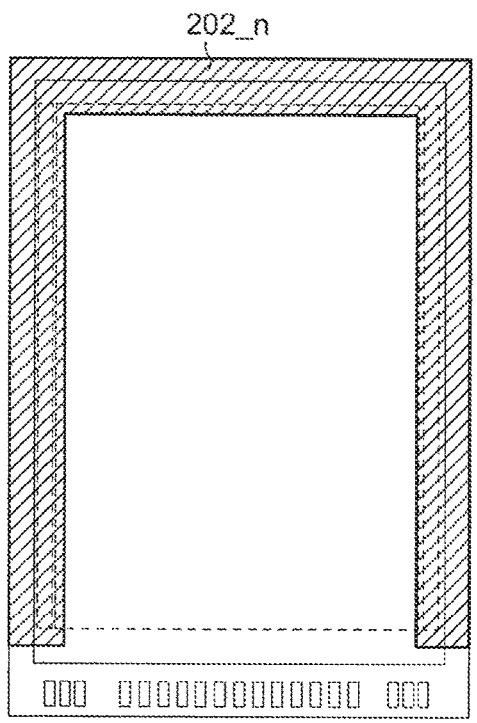
Figure 16D:
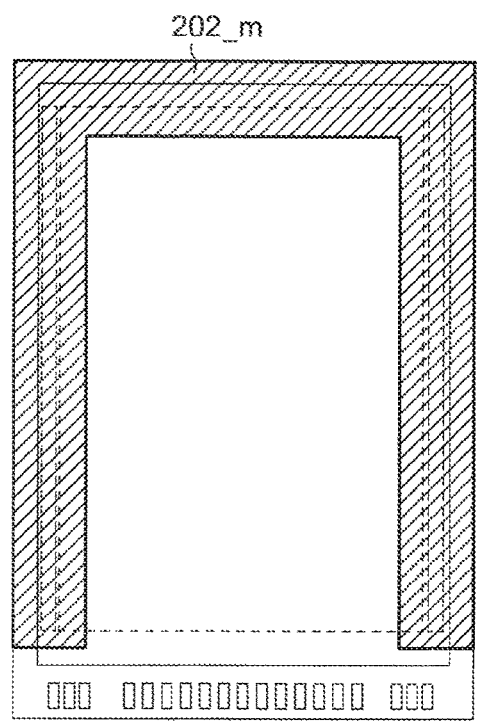
Figure 17B:
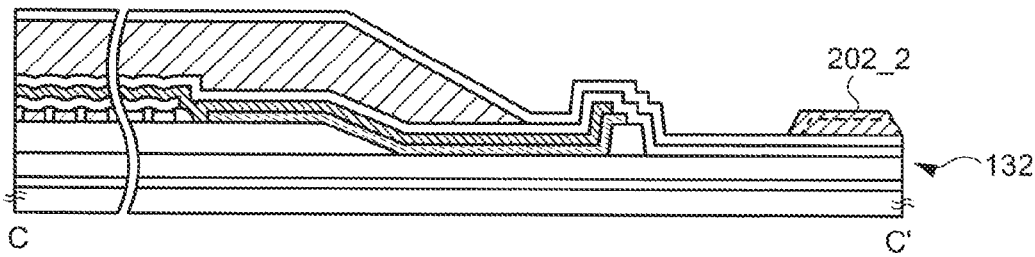
Figure 17C:
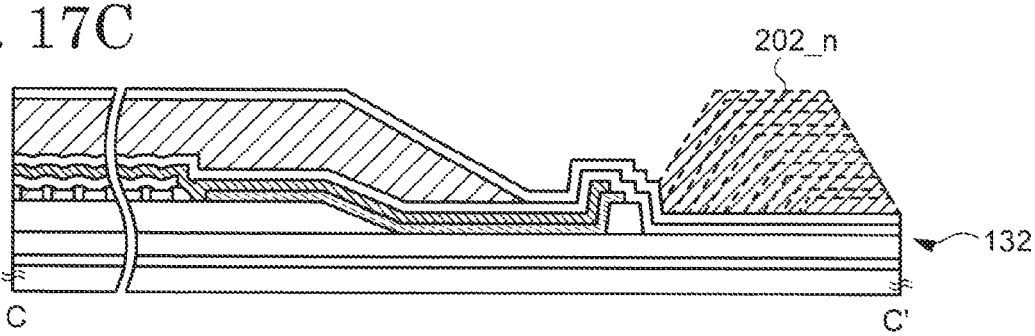
Figure 17D:
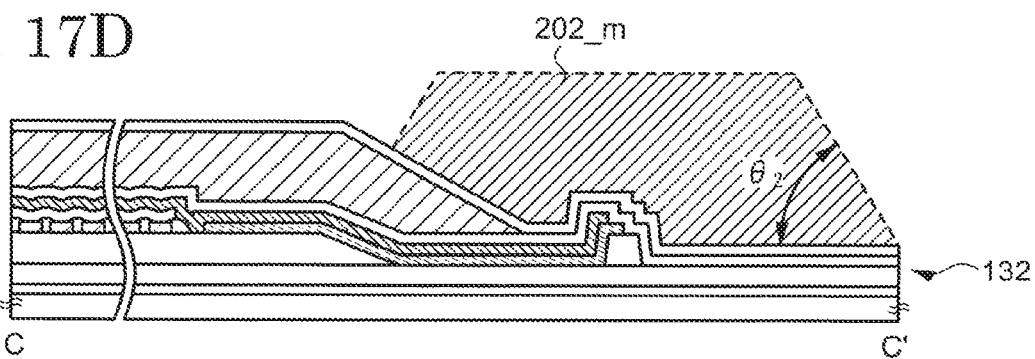

In a second step subsequent to the first step, the polymer solution is applied again over the rib 202_1 formed in the preceding step, and then the solvent is evaporatively removed. In the second step, the polymer solution may be selectively applied only over the rib 202_1. Alternatively, the polymer solution may be applied on a side toward the display region 114 from the rib 202_1 as well as over the rib 202_1 as shown in FIG. 16B and FIG. 17B. With this step, a rib 202_2 including the rib 202_1 is formed. Similar to the first step, the drops of the solution are selectively discharged so that the polymer solution is not applied in the region between the first side 130 and the display region 114. The rib 202_2 is also formed on the third side 134 and the fourth side 136. Hence, the rib 202_2 also extends along the second side 132, the third side 134, and the fourth side 136 between the edge portions of the substrate 102 and the display region 114 and gives an open shape in the plane parallel to the top surface of the substrate 102. The same step is repeated plural times (n times, n is a natural number equal to or larger than 2) to cause a gradual increase of the height and width of the rib 202, which leads to the formation of a rib 202_$n$ (FIG. 16C and FIG. 17C). These steps are further performed to provide a rib 202_m (FIG. 16D and FIG. 17D). Here, m is a natural number larger than n. The rib 202_m is fabricated so that a distance between a top surface of the rib 202_m and the top surface of the substrate 102 is larger than a distance between a surface of the passivation film 190 parallel to the top surface of the substrate 102 and the top surface of the substrate 102.

Figure 18:
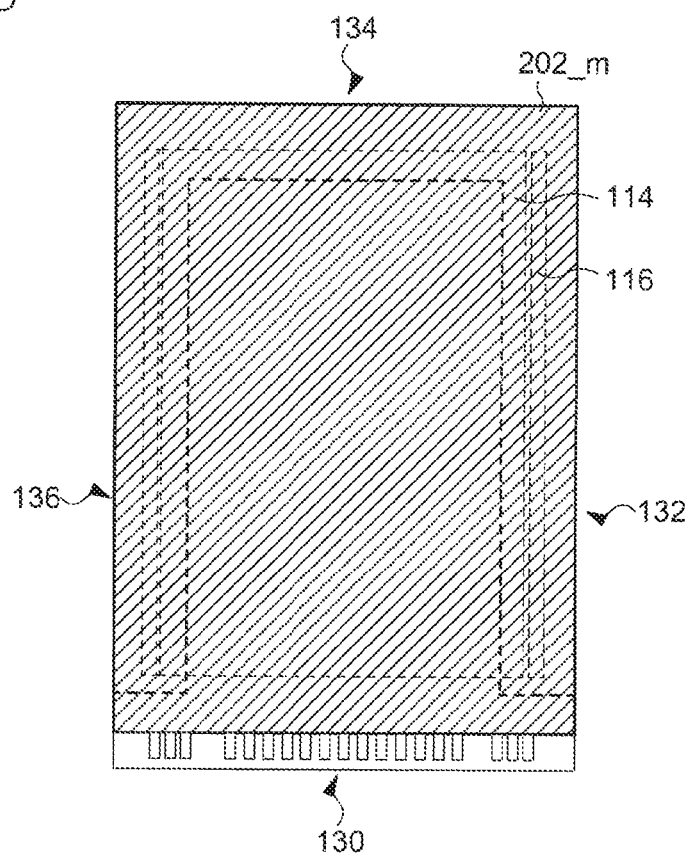
FIG. 18 is a schematic top view for explaining a manufacturing method of a display device according to an embodiment of the present invention.
Figure 19A:
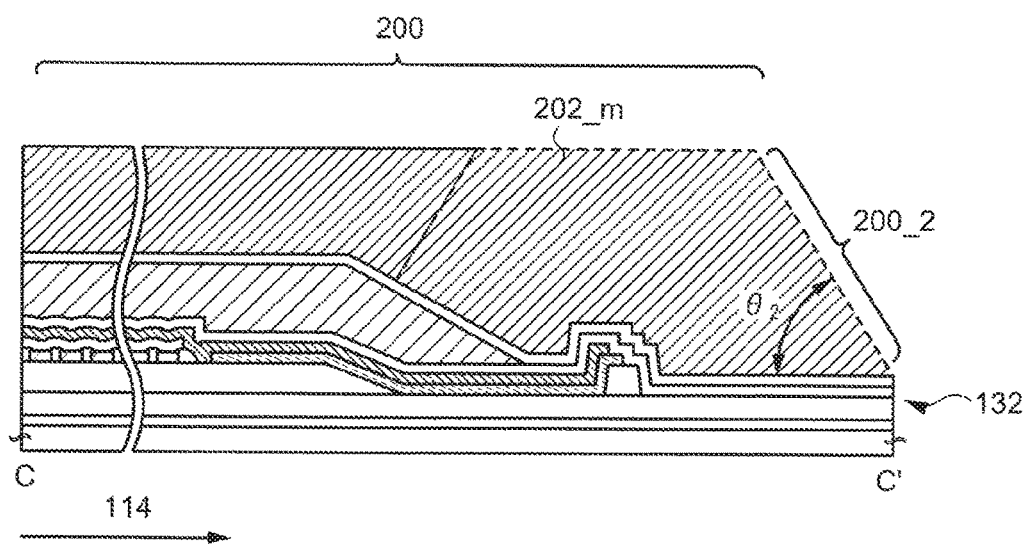
FIG. 19A and FIG. 19B are schematic cross-sectional views for explaining a manufacturing method of a display device according to an embodiment of the present invention.
Figure 19B:
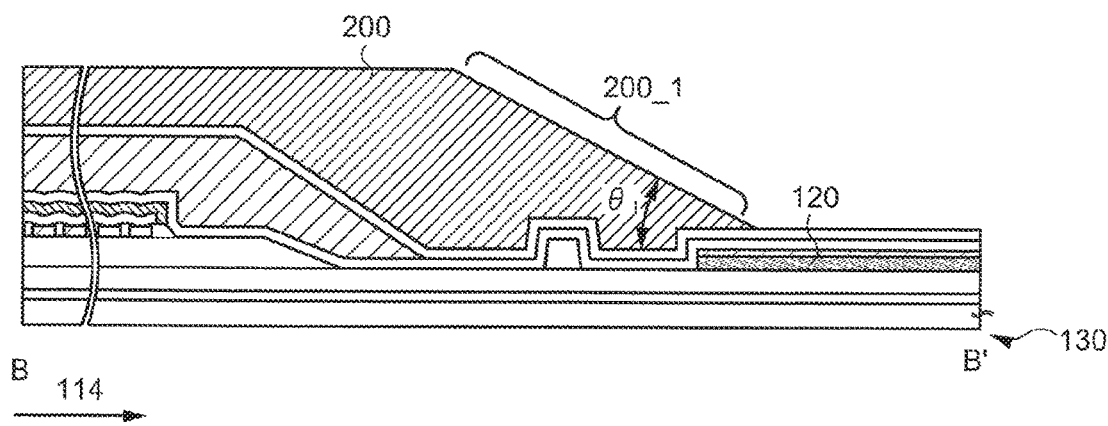

After forming the rib 202_m, the polymer solution is applied on the display region 114 surrounded by the rib 202_m and the region between the display region 114 and the first side 130, and then the solvent is evaporatively removed (FIG. 18). At this time, the polymer solution is applied so that a top surface of the barrier layer 200 formed over the display region 114 is substantially coplanar with the top surface of the rib 202_m (FIG. 19A). On the other hand, in the region between the display region 114 and the first side 130, the polymer solution is applied so that the edge portion of the barrier layer 200 to be formed partially overlaps with the terminals 120 and 122. That is, the polymer solution is applied so as not to reach the first side 130. With this process, a bottom side of the first sidewall 200_1 of the barrier layer 200 overlaps with the terminals 120 and 122.

Application of the polymer solution and evaporative removal of the solvent cause separation of the polymer in the solution to result in a thin film of the polymer. When the solution is applied again over this thin film, the drop of the solution exhibits a large contact angle on the thin film due to a low affinity between the thin film and the solution. Evaporative removal of the solvent in this state allows the slope of the sidewall of the rib 202, that is, the sidewall of the barrier layer 200 formed later, to be increased. Hence, the use of the aforementioned method enables the formation of the second sidewall 202_2 having a large second angle $\theta_2$. In a similar way, each sidewall is prepared on the third side 134 and the fourth side 136.

On the other hand, the stepwise application is not performed in the display region 114 surrounded by the rib 202_m and the region between the display region 114 and the first side 130. Alternatively, after the polymer solution is applied and before the solvent is completely evaporated, the following polymer solution is applied again. Since the polymer solution has a relatively high affinity with the third layer 196, the polymer solution spreads uniformly. Therefore, the slope of the barrier layer 200 (that is, the first sidewall 200_1) is small in the region between the display region 114 and the first side 130. Accordingly, the first sidewall 200_1 with small the first angle $\theta_1$ can be formed.

After that, etching is performed to expose the terminals 120 and 122. Specifically, the barrier layer 200 is used as a mask, and plasma etching is conducted in a gas including a fluorine-containing hydrocarbon to remove the first layer 192 and the third layer 196 covering the terminals 120 and 122 (FIG. 20A). With this process, the terminals 120 and 122 are exposed from the first layer 192 and the third layer 196.

An enlarged figure of the terminal 120 is shown in FIG. 20B. The etching proceeds anisotropically when the plasma etching is performed using the barrier layer 200 as a mask. Thus, the bottom side of the first sidewall 200_1 of the barrier layer 200 is able to exist on a plane in which a side surface of the third layer 196 exists. In other words, an upper side of the side surface of the third layer 196 may be in contact with the bottom side of the first sidewall 200_1 of the barrier layer 200. Note that, when the etching proceeds laterally (side etching), the top side of the side surface of the third layer 196 may be in contact with a bottom surface of the first sidewall 200_1 of the barrier layer 200 as shown in FIG. 20C.

3. Touch Sensor

Figure 21:
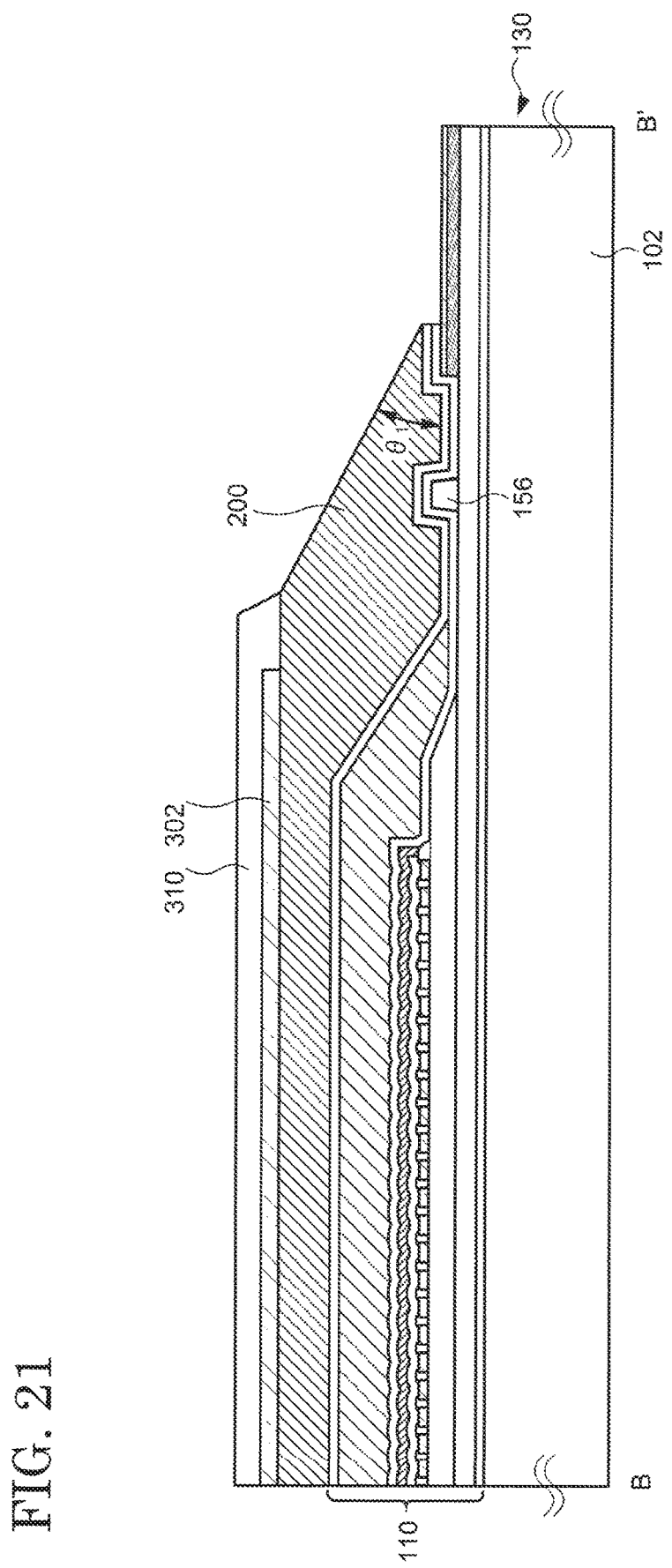
FIG. 21 is a schematic cross-sectional view for explaining a manufacturing method of a display device according to an embodiment of the present invention.

Next, the touch sensor 300 is fabricated. Specifically, the first touch electrodes 302 and the second touch electrodes 304 are formed over the barrier layer 200 with a sputtering method or a CVD method (FIG. 21). After that, the insulating layer 310 is formed so as to cover the first touch electrodes 302 and the second touch electrodes 304. The insulating layer 310 may be formed by applying a CVD method or a wet-type film-formation method.

Figure 22:
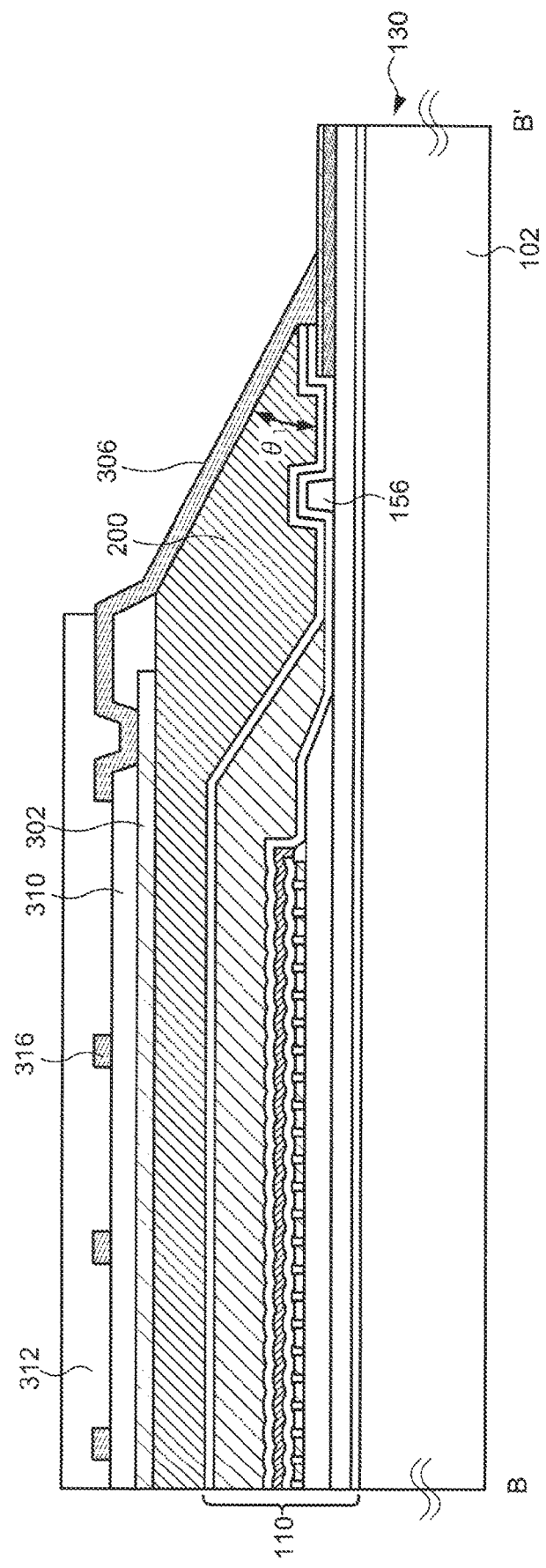
FIG. 22 is a schematic cross-sectional view for explaining a manufacturing method of a display device according to an embodiment of the present invention.
Figure 23:
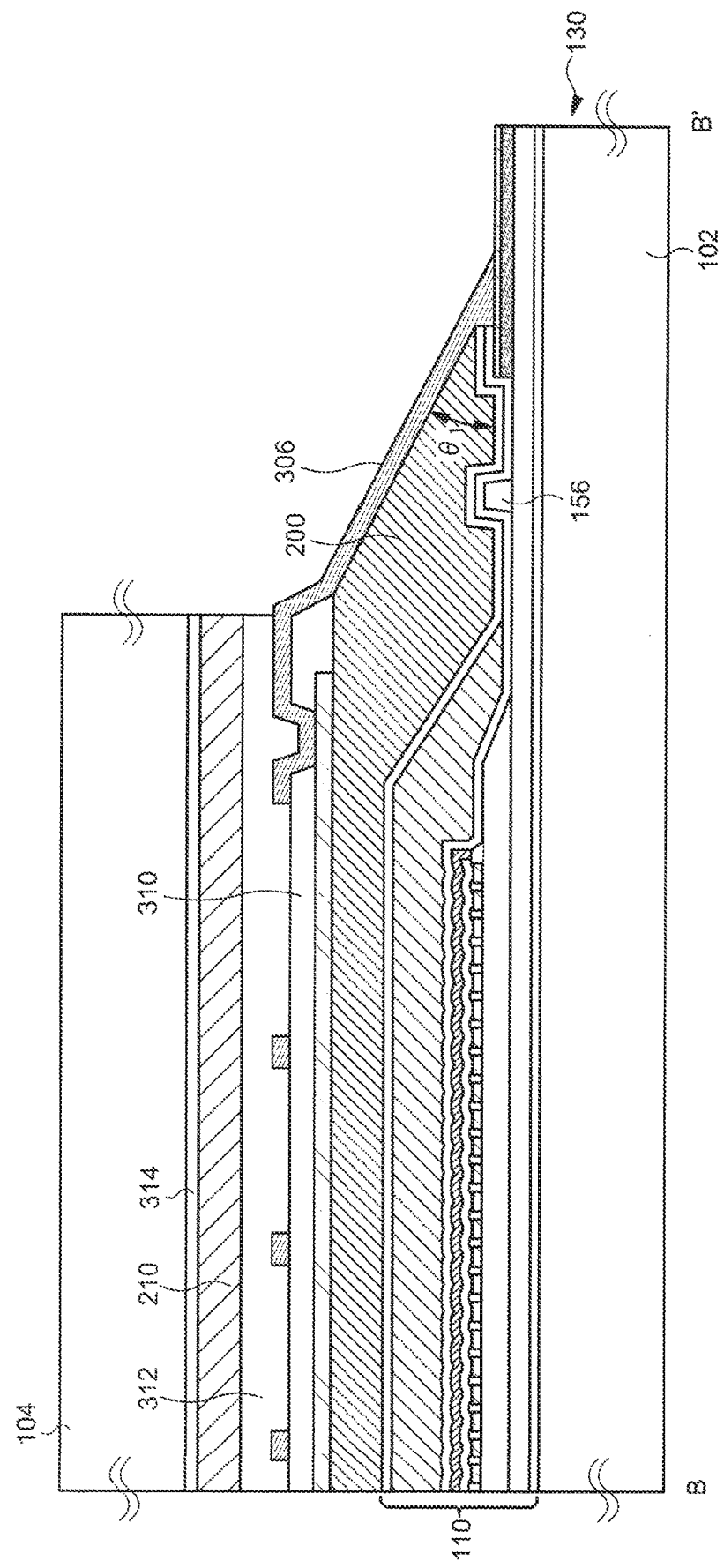
FIG. 23 is a schematic cross-sectional view for explaining a manufacturing method of a display device according to an embodiment of the present invention.

After that, the opening portions are formed in the insulating layer 310 with etching to expose the first touch electrodes 302 and the second touch electrodes 304 which are not illustrated here. Next, the wirings 306 and the bridge electrodes 316 are formed by using a CVD method or a sputtering method so as to cover these opening portions (FIG. 22). Furthermore, the protection film 312 may be formed by utilizing a CVD method or a wet-type film-formation method, and the polarizing plate 210 may be adhered with the protection film 312 sandwiched therebetween. After that, the opposing substrate 104 is arranged over the polarizing plate 210 through the adhesive layer 314. After that, the connector 126 is electrically connected to the terminals 120 and 122 by using the anisotropic conductive layer 212 (FIG. 6 and FIG. 7)

Through the aforementioned processes, the display device 100 is manufactured.

As described above, in the manufacturing method of the present embodiment, it is not necessary to shield the terminals 120 and 122 with a mask, and the first layer 192 and the third layer 196 can be formed so as to cover the terminals 120 and 122 when the first layer 192 and the third layer 196 of the passivation film 190 are prepared. The process to expose the terminals 120 and 122 from the first layer 192 and the third layer 196 for connection with the connector 126 can be carried out with etching using the barrier layer 200 as a mask. Since the barrier layer 200 can be formed by using an ink-jet method or a printing method, the region of the first layer 192 and the third layer 196 subjected to the etching can be precisely controlled. Hence, in addition to the reduction of manufacturing costs due to the reduction in the number of masks, precise control of the formation of the terminals 120 and 122 can be achieved.

Moreover, application of the manufacturing method of the present application enables the formation of the barrier layer 200 having sidewalls with different slopes. Accordingly, the touch sensor 300 can be fabricated over the display region 114 without losing the sealing function of the passivation film 190. Furthermore, the wirings 306 of the touch sensor 300 can be formed along a gentle slope by which disconnection thereof can be prevented.

Figure 24:
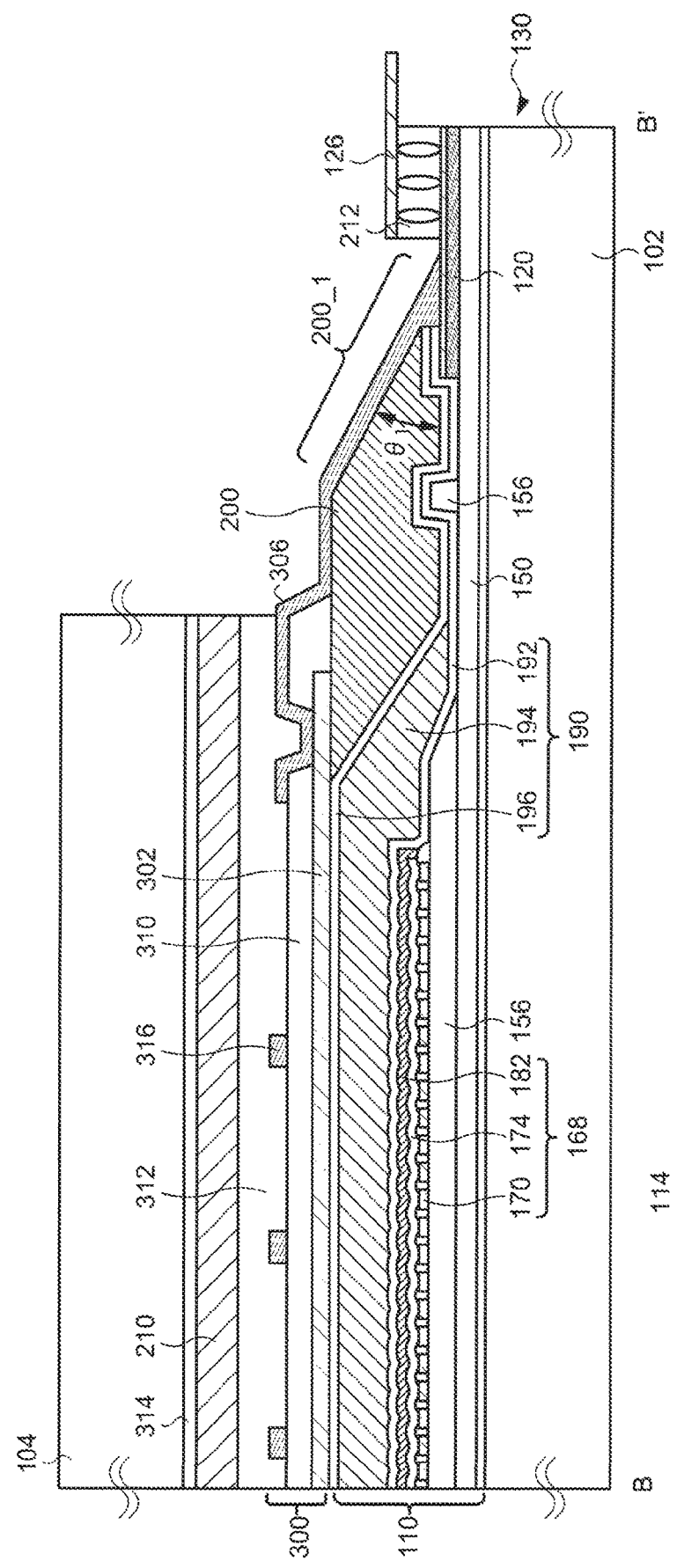
FIG. 24 is a schematic cross-sectional view of a display device according to an embodiment of the present invention.
Figure 25:
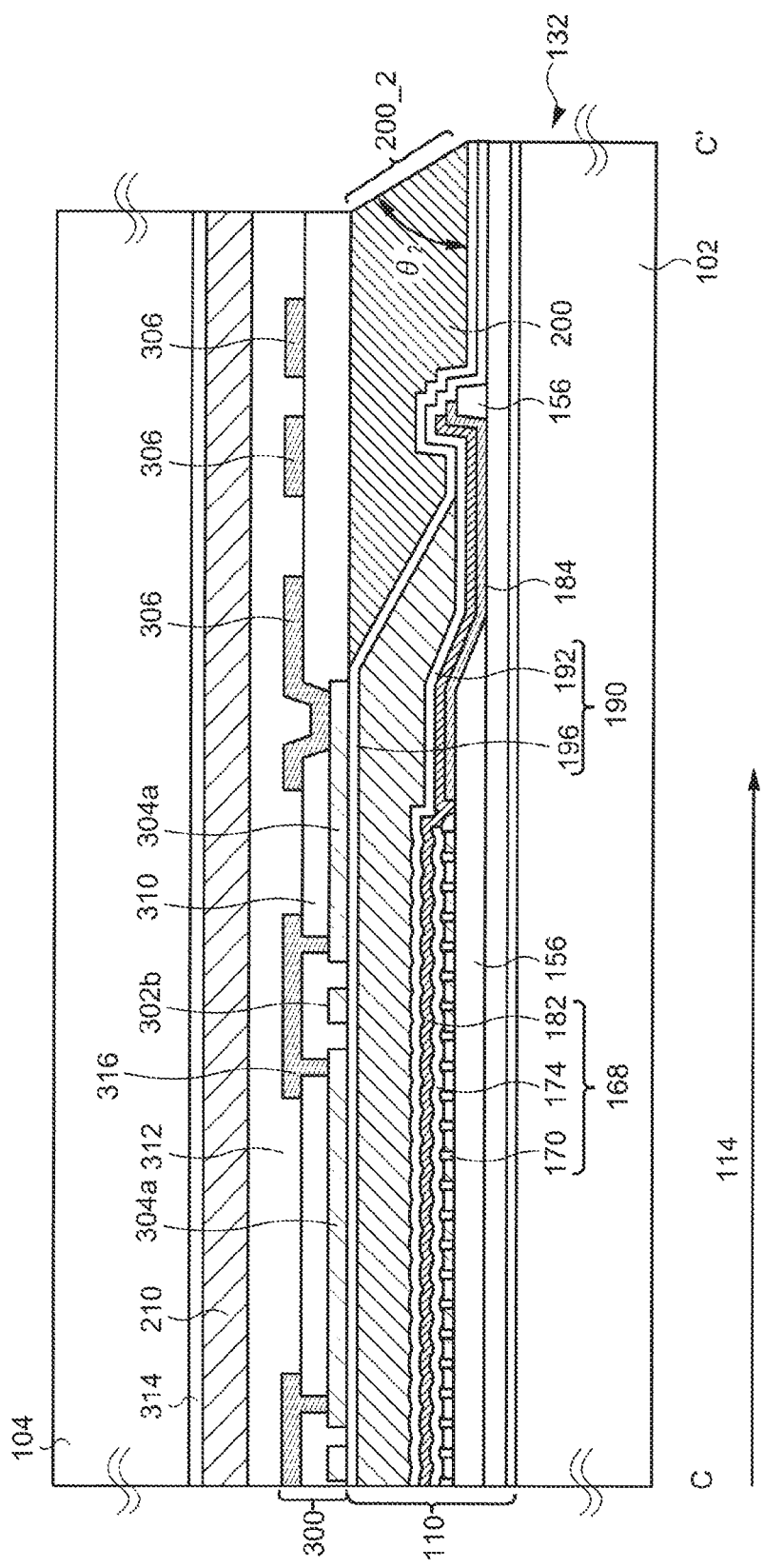
FIG. 25 is a schematic cross-sectional view of a display device according to an embodiment of the present invention.

Note that a structure may be employed in which there is no barrier layer 200 in the display region 114. For example, the structures shown in FIG. 24 and FIG. 25 are different from the structures shown in FIG. 6 and FIG. 7 which are respectively the schematic cross-sectional views along the chain lines B-B' and C-C' in FIG. 2 of the First Embodiment in that there is no barrier layer 200 in the display region 114. In this structure, the third layer 196 is in contact with the first touch electrodes 302 over the display region 114. With this structure, it is possible to form a flat surface over the display region 114 and a periphery thereof and to fabricate the touch sensor 300 over the flat surface. As a result, disconnection of the first touch electrodes 302 and the second touch electrodes 304 can be effectively prevented.

The aforementioned modes described as the embodiments of the present invention can be implemented by appropriately combining with each other as long as no contradiction is caused. Furthermore, any mode which is realized by persons ordinarily skilled in the art through the appropriate addition, deletion, or design change of elements or through the addition, deletion, or condition change of a process is included in the scope of the present invention as long as they possess the concept of the present invention.

In the specification, although the cases of the organic EL display device are exemplified, the embodiments can be applied to any kind of display devices of the flat panel type such as other self-emission type display devices, liquid crystal display devices, and electronic paper type display device having electrophoretic elements and the like. In addition, it is apparent that the size of the display device is not limited, and the embodiment can be applied to display devices having any size from medium to large.

It is properly understood that another effect different from that provided by the modes of the aforementioned embodiments is achieved by the present invention if the effect is obvious from the description in the specification or readily conceived by persons ordinarily skilled in the art.

What is claimed is:

1. A display device comprising:
    a substrate having a first edge portion, a second edge portion, and a third edge portion;
    a plurality of light-emitting elements located over the substrate and sandwiched between the first edge portion and the third edge portion;
    a passivation film over the plurality of light-emitting elements;
    a barrier layer over the passivation film, the barrier layer having a first sidewall along the first edge portion, a second sidewall along the second edge portion, and a third sidewall along the third edge portion; and
    a touch sensor over the barrier layer,
    wherein a first angle between a top surface of the substrate and a slope of the first sidewall is different from a second angle between the top surface and a slope of the second sidewall and is smaller than a third angle between the top surface and a slope of the third sidewall.

2. The display device according to claim 1, further comprising a plurality of terminals over the substrate,
    wherein the plurality of terminals is electrically connected to the plurality of light-emitting elements and arranged along the first edge portion, and
    the first angle is smaller than the second angle.

3. The display device according to claim 2,
    wherein the first angle is larger than 0° and equal to or smaller than 5°, and
    the second angle is equal to or larger than 20° and equal to or smaller than 45°.

4. The display device according to claim 1,
    wherein the passivation film comprises:
        a first layer including an inorganic compound;
        a second layer over the first layer, the second layer including an organic compound; and
        a third layer over the second layer, the third layer including an inorganic compound, and
    an upper side of a sidewall of the third layer is in contact with a bottom side of the first sidewall or a bottom surface of the barrier layer.

5. The display device according to claim 4,
    wherein the organic compound is a polymer.

6. A display device comprising:
    a substrate having a first edge portion, a second edge portion, and a third edge portion;
    a plurality of pixels located over the substrate, sandwiched by the first edge portion and the third edge portion, and each including a transistor and a light-emitting element electrically connected to the transistor;
    a passivation film over the plurality of pixels;
    a barrier layer over the passivation film, the barrier layer having a first sidewall along the first edge portion, a second sidewall along the second edge portion, and a third sidewall along the third edge portion; and
    a touch sensor over the barrier layer,
    wherein a first angle between a top surface of the substrate and a slope of the first sidewall is different from a second angle between the top surface and a slope of the second sidewall and is smaller than a third angle between the top surface and the third sidewall.

7. The display device according to claim 6, further comprising a plurality of terminals over the substrate,
    wherein the plurality of terminals is electrically connected to the plurality of light-emitting elements and arranged along the first edge portion, and
    the first angle is smaller than the second angle.

8. The display device according to claim 7,
    wherein the first angle is larger than 0° and equal to or smaller than 5°, and
    the second angle is equal to or larger than 20° and equal to or smaller than 45°.

9. The display device according to claim 6,
    wherein the passivation film comprises:
        a first layer including an inorganic compound;
        a second layer over the first layer, the second layer including an organic compound; and
        a third layer over the second layer, the third layer including an inorganic compound, and
    an upper side of a sidewall of the third layer is in contact with a bottom side of the first sidewall or a bottom surface of the barrier layer.

10. The display device according to claim 9,
    wherein the organic compound is a polymer.

* * * * *